(12) United States Patent
Büsing et al.

(10) Patent No.: US 7,910,687 B2
(45) Date of Patent: Mar. 22, 2011

(54) CONJUGATED POLYMERS CONTAINING ARYLAMINE UNITS, THE REPRESENTATION THEREOF AND THE USE OF THE SAME

(75) Inventors: Arne Büsing, Frankfurt am Main (DE); Esther Breuning, Eppstein-Niederjosbach (DE); Hubert Spreitzer, Viernheim (DE); Heinrich Becker, Eppstein-Niederjosbach (DE); Corinna Leske, Frankfurt am Main (DE)

(73) Assignee: Merck Patent GmbH (DE)

( * ) Notice: Subject to any disclaimer, the term of this patent is extended or adjusted under 35 U.S.C. 154(b) by 1106 days.

(21) Appl. No.: 10/532,465

(22) PCT Filed: Oct. 17, 2003

(86) PCT No.: PCT/EP03/11510
§ 371 (c)(1),
(2), (4) Date: Jun. 7, 2005

(87) PCT Pub. No.: WO2004/037887
PCT Pub. Date: Jun. 5, 2004

(65) Prior Publication Data
US 2006/0058494 A1   Mar. 16, 2006

(30) Foreign Application Priority Data

Oct. 25, 2002 (DE) .................. 102 49 723

(51) Int. Cl.
*C08G 73/00* (2006.01)
*C08G 79/08* (2006.01)
(52) U.S. Cl. .................. 528/422; 528/4; 528/7
(58) Field of Classification Search .................. 528/86, 528/211, 422, 4, 7
See application file for complete search history.

(56) References Cited

U.S. PATENT DOCUMENTS

| 5,254,633 | A | * | 10/1993 | Han et al. | 525/327.4 |
|---|---|---|---|---|---|
| 5,576,460 | A | | 11/1996 | Buchwald et al. | |
| 5,621,131 | A | | 4/1997 | Kreuder et al. | |
| 5,679,760 | A | | 10/1997 | Mullen et al. | |
| 5,712,361 | A | | 1/1998 | Stern et al. | |
| 5,728,480 | A | | 3/1998 | Stern et al. | |
| 5,763,636 | A | | 6/1998 | Kreuder et al. | |
| 5,777,070 | A | * | 7/1998 | Inbasekaran et al. | 528/394 |
| 5,814,244 | A | | 9/1998 | Kreuder et al. | |
| 5,846,666 | A | * | 12/1998 | Hu et al. | 428/690 |
| 5,948,552 | A | * | 9/1999 | Antoniadis et al. | 428/690 |
| 6,034,206 | A | * | 3/2000 | Yamamoto et al. | 528/397 |
| 6,130,001 | A | * | 10/2000 | Shi et al. | 428/690 |
| 6,194,089 | B1 | * | 2/2001 | Choong et al. | 428/690 |
| 6,476,265 | B1 | | 11/2002 | Spreitzer et al. | |
| 6,492,079 | B2 | * | 12/2002 | Shimada et al. | 430/58.05 |
| 6,541,602 | B1 | | 4/2003 | Spreitzer et al. | |
| 6,653,438 | B1 | | 11/2003 | Spreitzer et al. | |
| 6,689,491 | B1 | * | 2/2004 | Nii et al. | 428/690 |
| 7,205,366 | B2 | * | 4/2007 | Jaycox et al. | 526/234 |
| 7,288,617 | B2 | * | 10/2007 | Treacher et al. | 528/86 |
| 7,323,533 | B2 | * | 1/2008 | Becker et al. | 528/86 |
| 2001/0002417 | A1 | * | 5/2001 | Akkara et al. | 528/86 |
| 2001/0017155 | A1 | * | 8/2001 | Bellmann et al. | 136/263 |
| 2002/0173617 | A1 | * | 11/2002 | Yasuda et al. | 528/422 |
| 2003/0010959 | A1 | * | 1/2003 | Lee et al. | 252/500 |
| 2003/0207187 | A1 | * | 11/2003 | Seki et al. | 430/58.7 |
| 2003/0225234 | A1 | * | 12/2003 | Jaycox et al. | 526/329.7 |
| 2004/0002576 | A1 | * | 1/2004 | Oguma et al. | 528/4 |
| 2004/0081854 | A1 | * | 4/2004 | Hirose et al. | 428/690 |
| 2004/0126683 | A1 | * | 7/2004 | Jin et al. | 430/58.2 |
| 2004/0133004 | A1 | | 7/2004 | Stossel et al. | |
| 2004/0135131 | A1 | | 7/2004 | Treacher et al. | |
| 2004/0138455 | A1 | | 7/2004 | Stossel et al. | |
| 2004/0225056 | A1 | | 11/2004 | Spreitzer et al. | |
| 2004/0260090 | A1 | | 12/2004 | Treacher et al. | |
| 2005/0038223 | A1 | | 2/2005 | Becker et al. | |

FOREIGN PATENT DOCUMENTS

| DE | 198 46 767 | 4/2000 |
|---|---|---|
| DE | 101 16 962 | 10/2002 |
| DE | 101 43 353 | 3/2003 |
| DE | 102 38 903 | 3/2004 |
| DE | 102 41 814 | 3/2004 |
| EP | 0 423 283 | 4/1991 |
| EP | 0 690 086 | 1/1996 |
| EP | 0 699 699 | 3/1996 |
| EP | 0 707 020 | 4/1996 |
| EP | 0 802 173 | 10/1997 |
| EP | 0 842 208 | 5/1998 |
| EP | 0 894 107 | 2/1999 |
| EP | 0 973 210 | 1/2000 |
| EP | 1 025 142 | 8/2000 |
| EP | 1 239 526 | 9/2002 |
| EP | 1 245 659 | 10/2002 |
| EP | 1 394 188 A1 | 3/2004 |
| JP | 2002-237384 | 8/2002 |
| WO | WO-92/18552 | 10/1992 |
| WO | WO-99/12888 | 3/1999 |
| WO | WO-99/54385 | 10/1999 |
| WO | WO-00/22026 | 4/2000 |
| WO | WO-00/22027 | 4/2000 |
| WO | WO-00/46321 | 8/2000 |
| WO | WO-00/53656 | 9/2000 |
| WO | WO-01/49769 | 7/2001 |
| WO | WO-01/66618 | 9/2001 |
| WO | WO-02/068435 | 9/2002 |
| WO | WO-02/072714 | 9/2002 |

(Continued)

OTHER PUBLICATIONS

Bernius et al. (Adv. Mater, 2000, 12(23), p. 1737-1750).*

*Primary Examiner* — Mark Eashoo
*Assistant Examiner* — Liam J Heincer
(74) *Attorney, Agent, or Firm* — Connolly Bove Lodge & Hutz LLP

(57) ABSTRACT

The present invention relates to conjugated polymers which contain specific fused arylamine structural units. The inventive materials have improved efficiency at a high illumination density and are therefore suitable in particular for use in what are known as passive matrix displays.

18 Claims, No Drawings

FOREIGN PATENT DOCUMENTS

| WO | WO-02/077060 | 10/2002 |
| WO | WO 02077060 A1 * | 10/2002 |
| WO | WO-03/000773 A1 | 1/2003 |
| WO | WO-03/020790 | 3/2003 |
| WO | WO 03020790 A2 * | 3/2003 |
| WO | WO-03/048225 | 6/2003 |

* cited by examiner

US 7,910,687 B2

CONJUGATED POLYMERS CONTAINING ARYLAMINE UNITS, THE REPRESENTATION THEREOF AND THE USE OF THE SAME

RELATED APPLICATIONS

This application is a national stage application (under 35 U.S.C. 371) of PCT/EP2003/011510 filed Oct. 17, 2003 which claims benefit to German application 102 49 723.0 filed Oct. 25, 2002.

For about the last 12 years, broadly based research has proceeded into the commercialization of display and illumination elements based on polymeric (organic) light-emitting diodes (PLEDs). This development was triggered by the fundamental developments which are disclosed in EP 423 283 (WO 90/13148). Recently, a first product in the form of a relatively small display (in a shaver from PHILIPS N.V.) has become available on the market. However, distinct improvements are still necessary for these displays to provide real competition to the currently market-leading liquid crystal displays (LCDs) or to overtake them. In particular, it is necessary in this context to provide polymers for all emission colors (red, green, blue) which satisfy the requirements of the market (color saturation, efficiency, operative lifetime, to name the most important).

Various material classes have been proposed or developed as polymers for full-color display elements. One such material class is that of polyfluorene derivatives, as disclosed, for example, in EP-A-0 842 208, WO 99/54385, WO 00/22027, WO 00/22026 and WO 00/46321. In addition, poly-spiro-bifluorene derivatives, as disclosed in EP-A-0 707 020, EP-A-0 894 107 and WO 03/020790, are also a possibility. Polymers which contain a combination of the first two structural elements mentioned, as disclosed in WO 02/077060, have also already been proposed. In general, polymers which contain poly-para-phenylene (PPP) as a structural element are possible for such a use. In addition to the classes already mentioned above, examples of other classes which are also useful here are what are known as the ladder PPPs (LPPPs, for example according to WO 92/18552), the polytetrahydropyrenes (for example according to EP-A-699699), but also PPPs containing ansa structures (for example according to EP-A-690086).

As has been used as a starting point in some of the above-mentioned applications, it is necessary for the generation of all three emission colors to copolymerize particular comonomers into the corresponding polymers (cf. for example WO 00/46321, DE 10143353.0 and WO 02/077060). It is then generally possible, starting from a blue-emitting backbone, to generate the two other primary colors, red and green.

In addition, it has been reported that the introduction of particular arylamino moieties results in an improvement in the properties:

WO 99/54385 describes polyfluorenes, whose efficiency and use voltage can be improved by also copolymerizing derivatives of triphenylamine, tetraphenyl-p-diaminobenzene or tetraphenyl-4,4'-diaminobiphenyl into the main chain of the corresponding polymers.

DE-A-19846767 describes polyfluorenes in which the efficiency and use voltage are likewise improved by incorporating substituted diarylamino units into the main chain.

WO 01/49769 describes, in general terms, polymers which contain triarylamino groups in which at least one aryl group is a heteroaryl group. Particular advantages of these polymers are not described.

WO 01/66618 describes copolymers which, in addition to aryl units, also contain specific triarylamino- or tetraaryl-p-diaminoarylene units in the main chain. The corresponding amino building blocks contain phenyls each substituted by trifluoromethyl groups, which are bonded directly to the nitrogen atoms but not incorporated into the main chain. An advantage which is mentioned is that these materials, in particular in contrast to the derivatives which are specified in the abovementioned WO 99/54385, have a HOMO position with better adjustability, which therefore brings advantages in the application.

In spite of the advances cited in the abovementioned applications, there is still a considerable need for improvement in corresponding materials. A distinct need for improvement can be seen in particular in the following fields:

the operative lifetime, in particular in BLUE-emitting polymers, still needs a distinct improvement in order to be able to use them for marketable applications.

the efficiency, in particular at high illumination densities, is still in need of improvement for all colors. This is of crucial importance in particular for use in what are known as passive matrix-controlled (PM) displays: in these PM displays, each individual pixel is addressed only for a fraction of the time (this fraction is referred to as the multiplex rate (MUX)). An MUX-64 or an MUX-128 display means that each individual pixel is addressed, respectively, only for 1/64 or 1/128 of the total time. In order nevertheless to obtain the desired brightness, the particular pixel has to illuminate more brightly within this short time by the same factor (i.e. 64 and 128 respectively in these cases) than would actually be necessary for the desired brightness. When the intention is thus, for example, to operate a pixel with an average brightness of 200 $Cd/m^2$, 12 800 or even 25 600 $Cd/m^2$ are required briefly. As a result of the slowness of the human eye, the observer then, in the case of suitable addressing, receives the impression of the average brightness value. Currently, the problem with this addressing is as follows: the polymers utilized to date, specifically for full-color displays, show a high dependence of efficiency upon the brightness required; for example, a BLUE-emitting polymer (with CIE1931 color coordinates of X=0.15, Y=0.16; cf. Example C1) exhibits a loss of efficiency of more than a factor of 2 in the course of the transition from 200 $Cd/m^2$ to a brightness of 30 000 $Cd/m^2$ (cf. also data in Table 2 in the experimental section). As is readily evident from this, the use of such a polymer presents great difficulties for PM-addressed displays.

As is evident from this description of the prior art, there is still a great need for further development in the field of light-emitting polymers.

We have now found that, surprisingly, polymers which contain particular, hitherto unknown arylamino units result in distinct improvements, specifically in the two abovementioned fields, i.e. the operative lifetime and the efficiency at high illumination densities. These are therefore provided by the present application.

The invention therefore provides conjugated polymers which contain at least 1 mol %, preferably at least 5 mol %, most preferably at least 10 mol %, of units of the formula (I)

FORMULA (I)

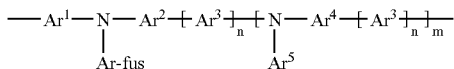

where the symbols and indices are each defined as follows:

Ar$^1$, Ar$^3$ are the same or different at each instance and are each an aromatic or heteroaromatic ring system which has from 2 to 40 carbon atoms and may be substituted or else unsubstituted; the possible substituents R1 may potentially be at any free position;

Ar$^2$, Ar$^4$ are the same or different at each instance and are each Ar$^1$, Ar$^3$ or a substituted or unsubstituted stilbenylene or tolanylene unit;

Ar-fus is the same or different at each instance and is an aromatic or heteroaromatic ring system which has at least 9 but at most 40 atoms (carbon or heteroatoms) in the conjugated system which may be substituted or else unsubstituted and which consists of at least two fused rings; the possible substituents R1 may potentially be at any free position;

Ar$^5$ is the same or different at each instance and is either an aromatic or heteroaromatic ring system which has from 2 to 40 carbon atoms and may be substituted or else unsubstituted, or Ar-fus; the possible substituents R1 may potentially be at any free position;

m, n are the same or different at each instance and are each 0, 1 or 2;

R1 is the same or different at each instance and is a straight-chain, branched or cyclic alkyl or alkoxy chain having from 1 to 22 carbon atoms in which one or more nonadjacent carbon atoms may also be replaced by N—R2, O, S, —CO—O—, O—CO—O and one or more hydrogen atoms may also be replaced by fluorine, an aryl or aryloxy group having from 5 to 40 carbon atoms in which one or more carbon atoms may also be replaced by O, S or N and which may also be substituted by one or more nonaromatic R1 radicals, or Cl, F, CN, N(R2)$_2$, B(R2)$_2$, and two or more R1 radicals together may also form a ring system;

R2 is the same or different at each instance and is H, a straight-chain, branched or cyclic alkyl chain having from 1 to 22 carbon atoms in which one or more nonadjacent carbon atoms may also be replaced by O, S, —CO—O—, O—CO—O and one or more hydrogen atoms may also be replaced by fluorine, an aryl group having from 5 to 40 carbon atoms in which one or more carbon atoms may also be replaced by O, S or N and which may also be substituted by one or more nonaromatic R1 radicals, with the proviso that the units according to the structures (1) to (3)

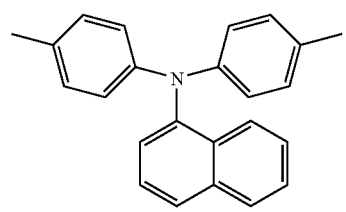

(1)

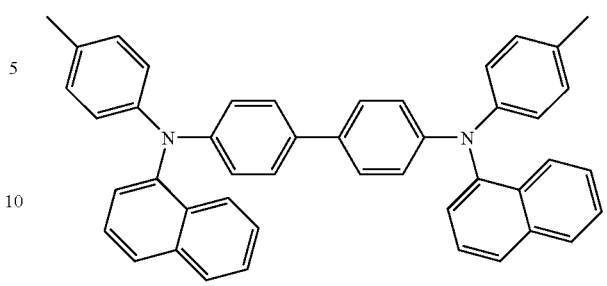

(2)

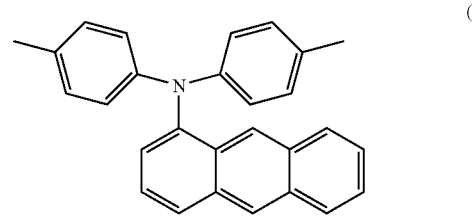

(3)

are excluded when the conjugated polymer contains metal complexes which enable a transfer of singlet excitons to triplet excitons.

In the context of this invention, conjugated polymers are intended to mean polymers which contain, in the main chain, mainly sp$^2$-hybridized carbon atoms which may also be replaced by corresponding heteroatoms. In the simplest case, this means alternating presence of double and single bonds in the main chain. Mainly means that naturally occurring defects which lead to interruptions in conjugation do not disqualify the term "conjugated polymers". However, this does not mean polymers which contain deliberately introduced larger amounts of nonconjugated segments. In addition, this application likewise refers to polymers as being conjugated when, for example, arylamine units of the formula (I) or other such units and/or particular heterocycles (i.e. conjugation via nitrogen, oxygen or sulfur atoms) and/or organometallic complexes (i.e. conjugation via the metal atom) are present in the main chain. In contrast, units such as simple (thio)ether bridges, ester linkages, amide or imide linkages, for example, would be defined unambiguously as nonconjugated segments.

In addition to the units of the formula (I), the inventive polymers may contain still further structural elements. These include those which have already been disclosed in the above-mentioned patent applications. Reference is made here in particular to the relatively comprehensive list in the application WO 02/077060 already mentioned above; this is regarded as a constituent of the present invention by reference. These further structural units may stem, for example, from the classes described below:

1. Structural units which can form the polymer backbone, or BLUE-emitting units:

mention should be made here first of polyphenylenes and structures derived therefrom. These are, for example, (in each case substituted or unsubstituted) meta- or para-phenylenes, 1,4-naphthylenes, 9,10-anthracenylenes, 2,7-phenanthrenylenes, 1,6- or 2,7- or 4,9-pyrenylenes or 2,7-tetrahydropyrenylenes. Corresponding heterocyclic "polyphenylene"-forming structures, for example oxadiazolylene, 2,5-thiophenylene, 2,5-pyrrolylene, 2,5-furanylene, 2,5-pyridylene, 2,5-pyrimidinylene, 3,6- or 2,7-carbazolylene or 5,8-quinolinylene are also useful.

in addition, more complex units such as the abovementioned fluorenes, spiro-9,9'-bifluorenes, multiply bridged units (for example short subsegments of the abovementioned LPPP polymers), but also "double fluorene" units (indenofluorenes) are possible. These too may be substituted or unsubstituted.

2. Structural units which, for example, shift the color of the emission, therefore also change the band gap of the polymer and thus generally change the charge injection or transport properties:

mention should be made here, for example, of further heterocyclic compounds such as the structures mentioned in the abovementioned application WO 02/077060 under the formulae (XX) to (XXXXV).

in addition, mention should also be made here of arylene-vinylene or arylene-acetylene structures such as substituted or unsubstituted stilbenylenes, tolanylenes, bis-styrylarylenes, bis(arylacetylene)arylenes.

finally, the incorporation of larger aromatic units, for example chrysenes, naphthacenes, pentacenes, perylenes or coronenes, can also generate the abovementioned effect (color shift).

3. Structural units which enable a transfer of singlet excitons to triplet excitons and which can emit light with high efficiency from the triplet state even at room temperature:

this refers firstly in particular to compounds which contain heavy atoms, i.e. atoms from the Periodic Table of the Elements having an atomic number of more than 36.

particularly suitable compounds for this purpose contain d- and f-transition metals which fulfill the abovementioned condition to be. Corresponding structural units which contain elements of groups 8 to 10 (i.e. Ru, Os, Rh, Ir, Pd, Pt) appear to be very particularly preferable here.

useful structural units for the inventive polymers are, for example, various complexes which are described, for example, in the applications WO 02/068435, DE 10116962, EP 1239526, and the unpublished application DE 10238903.9.

for polymers according to the structural units described here, there is an incidental disclosure in EP-A-1245659 of units which are inventive per se, but they are mentioned there without particular advantages. Accordingly, polymers containing metal complexes and units of the structures (1) to (3) are excluded from the invention:

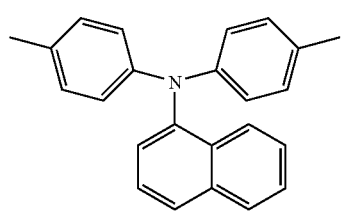

(1)

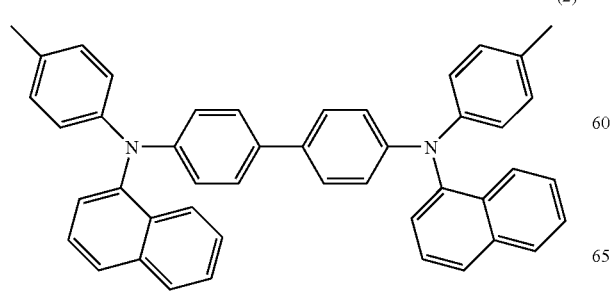

(2)

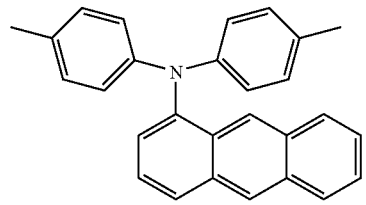

(3)

A selection of preferred further units of the inventive polymers is listed in the following overview:

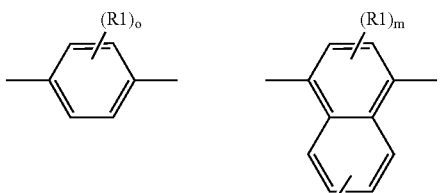

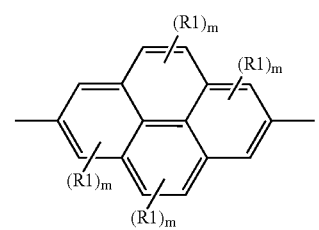

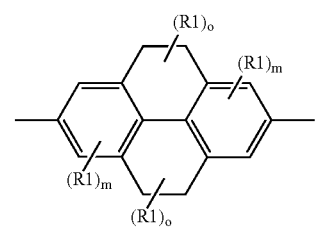

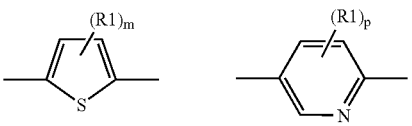

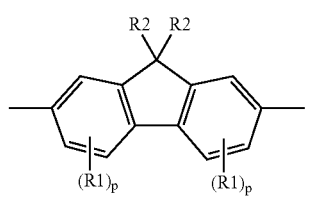

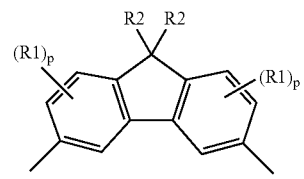

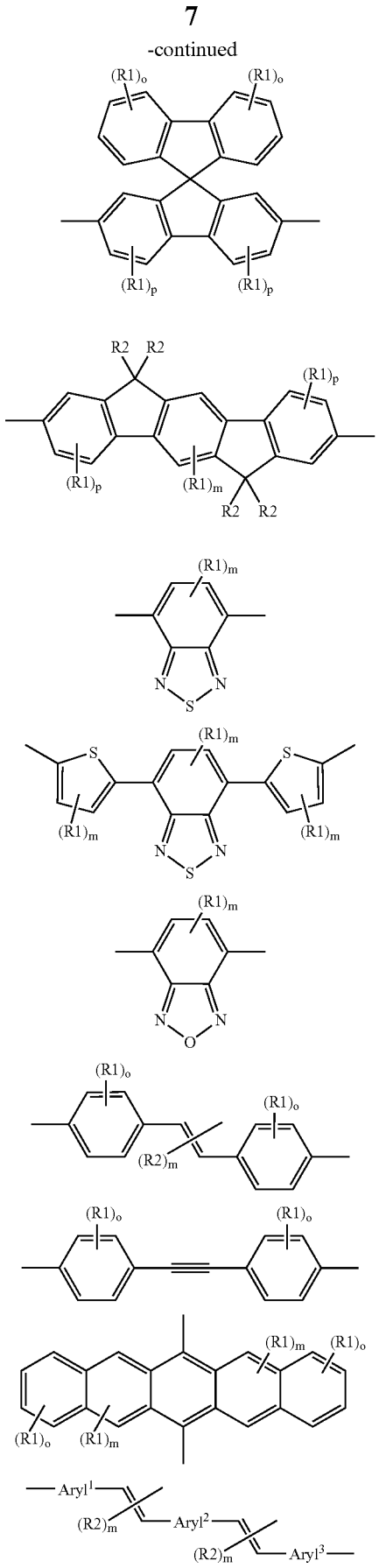

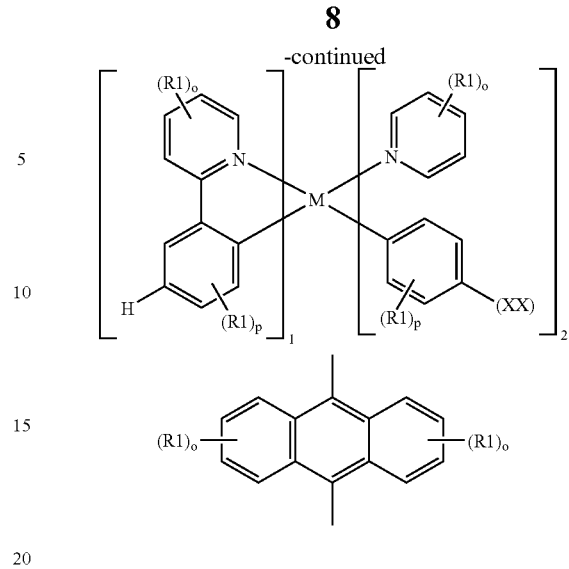

The symbols R1, R2, aryl$^1$, aryl$^2$, aryl$^3$ and indices m and n used are to be understood analogously to those already described above.

o is the same or different at each instance and is 0, 1, 2, 3 or 4;
p is the same or different at each instance and is 0, 1, 2 or 3;
M is the same or different at each instance and is Rh or Ir;
(XX) symbolizes the bond within the polymer.

The single bond shows the bond within the polymer; here, it does not symbolize a methyl group.

The inventive polymers are either homopolymers, i.e. they then contain only one structure of the formula (I), or they are copolymers. It may be preferred in this context that they either contain a plurality of different structural units of the formula (I) or contain one or more of the above-described or -listed structural units in addition to one or more structural unit(s) of the formula (I).

The inventive copolymers may have random, alternating or else blocklike structures, or else have a plurality of these structures in alternation. The use of a plurality of different structural elements allows properties such as solubility, solid phase morphology, color, etc. to be adjusted.

As described above, particularly preferred inventive polymers contain at least 10 mol % of structural units of the formula (I). Specifically for the application in the PLEDs mentioned as an emitting material, a proportion in this order of magnitude has been found to be favorable. For other applications, for example as a charge transport layer in organic field-effect transistors (OFETs), a distinctly higher proportion (up to 100 mol %) may also be found to be favorable.

For preferred structures of the formula (I), the following applies:

Ar$^1$, Ar$^2$, Ar$^3$, Ar$^4$ are the same or different at each instance and are each an aromatic or heteroaromatic ring system selected from thiophene, benzene, pyridine, fluorene, spirobifluorene, anthracene or naphthalene, each of which bear from 0 to 2 substituents R1 at the free positions;

Ar-fus is the same or different at each instance and is an aromatic or heteroaromatic ring system selected from naphthalene, quinoline, anthracene, phenanthrene or pyrene, each of which bear from 0 to 2 substituents R1 at the free positions;

Ar$^5$ is the same or different at each instance and is an aromatic or heteroaromatic ring system selected from benzene, naphthalene, quinoline, anthracene, phenanthrene or pyrene, each of which bears from 0 to 2 substituents R1 at the free positions;

m, R1, R2 are analogous to the statements made above.

For particularly preferred structures of the formula (I), the following applies:

Ar¹, Ar², Ar³, Ar⁴ are the same or different at each instance and are each benzene, fluorene, anthracene or naphthalene, each of which does not bear any substituents, or fluorene is substituted only at 9 and 9';

Ar-fus is the same or different at each instance and is naphthalene, anthracene or phenanthrene, each of which bears 1 or 2 substituents R1 at the free positions;

Ar⁵ is the same or different at each instance and is naphthalene, anthracene or phenanthrene, each of which bears 1 or 2 substituents R1 at the free positions;

m, R1, R2 are analogous to the statements made above.

Very particularly preferred structures of the formula (I) are substituted or unsubstituted structures of the formulae (II) to (XXXIV) depicted, but potential substituents are usually not depicted for reasons of better clarity:

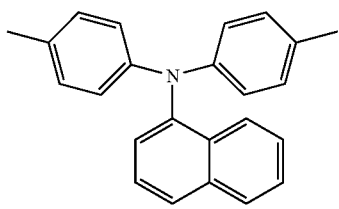

Formula (II)

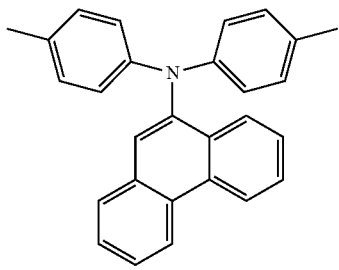

Formula (III)

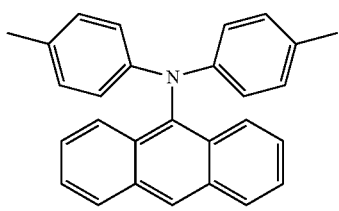

Formula (IV)

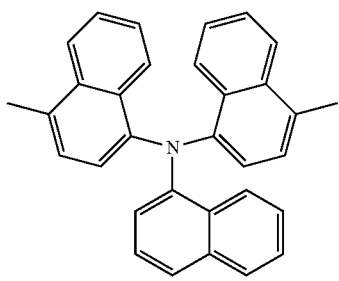

Formula (V)

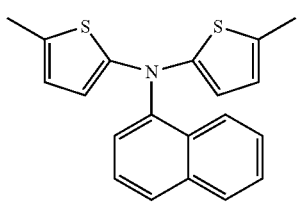

Formula (VI)

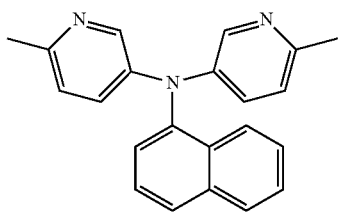

Formula (VII)

-continued
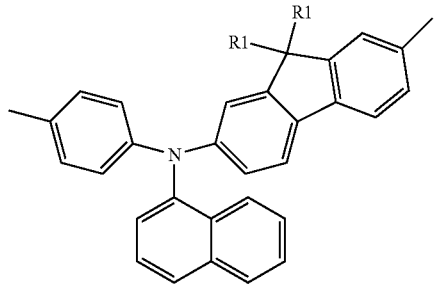
Formula (VIII)
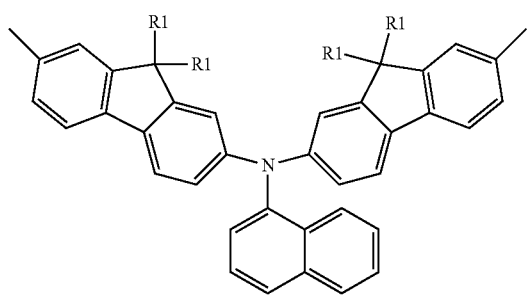
Formula (IX)
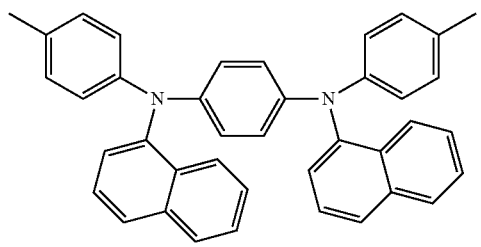
Formula (X)
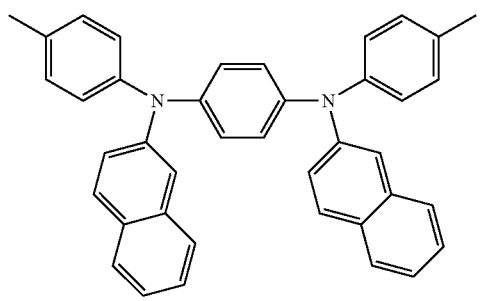
Formula (XI)
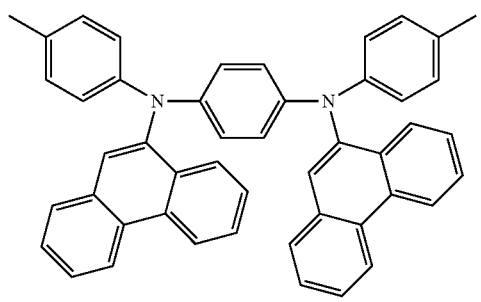
Formula (XII)

-continued
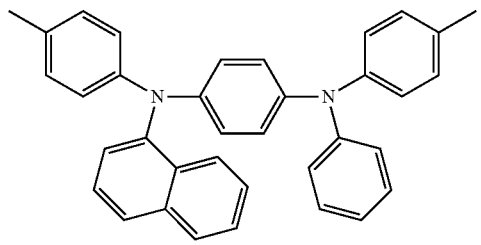
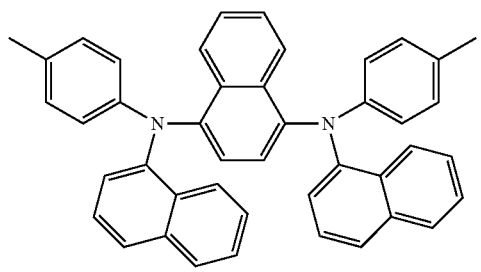
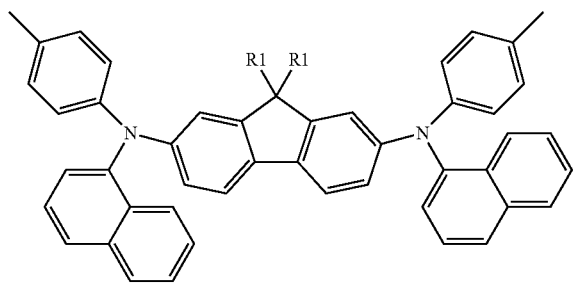
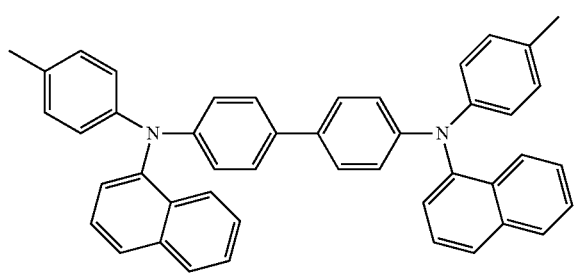
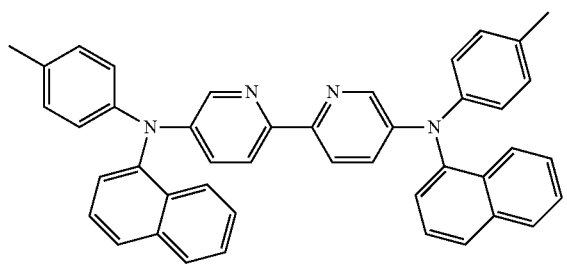
Formula (XIII)
Formula (XIV)
Formula (XV)
Formula (XVI)
Formula (XVII)

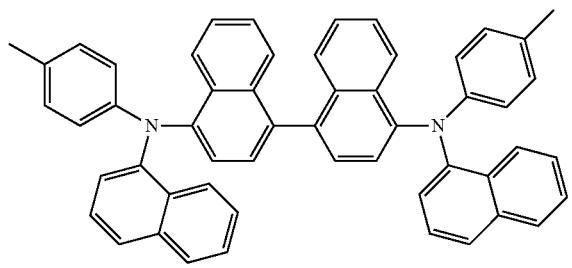
Formula (XVIII)
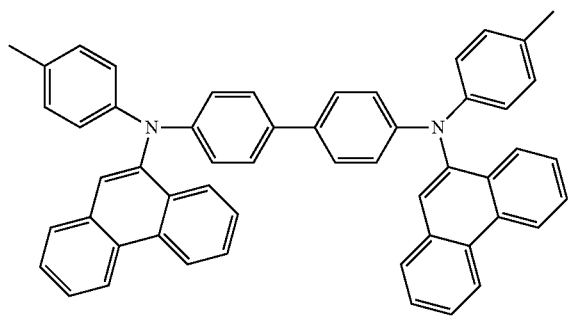
Formula (XIX)
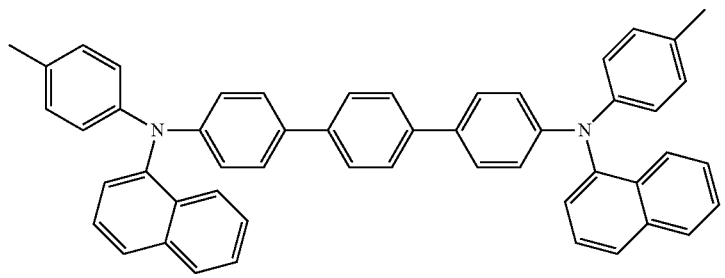
Formula (XX)
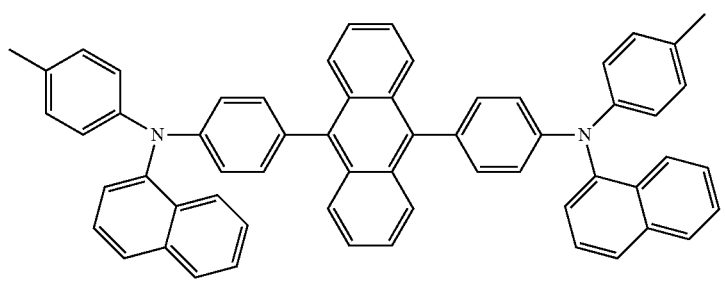
Formula (XXI)
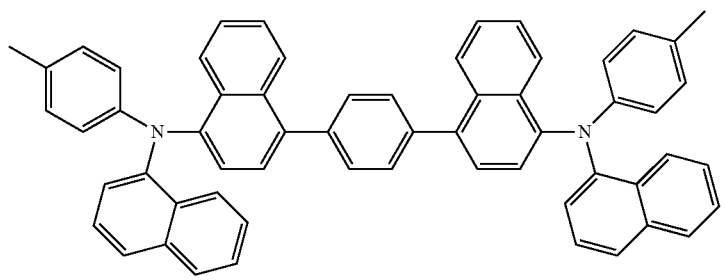
Formula (XXII)

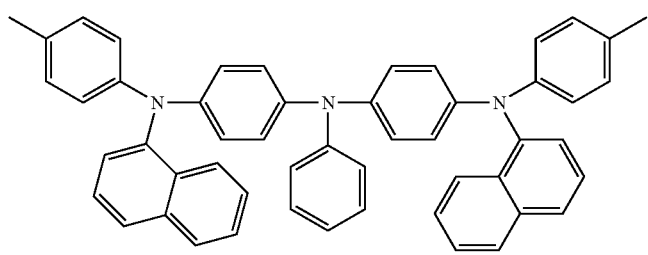
Formula (XXIII)
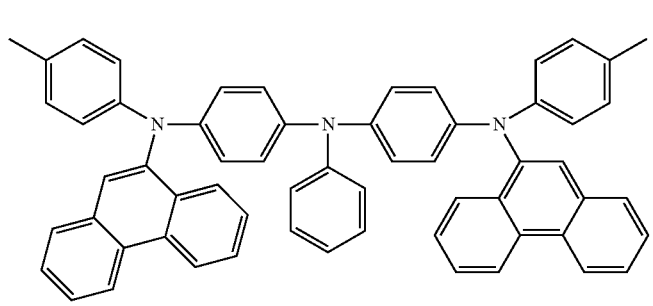
Formula (XXIV)
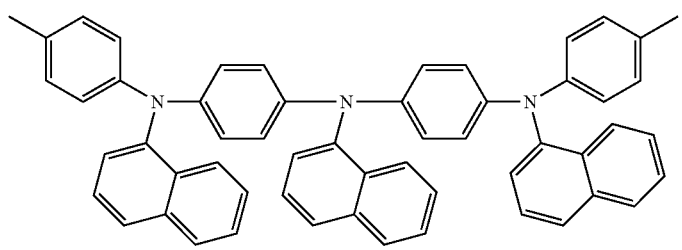
Formula (XXV)
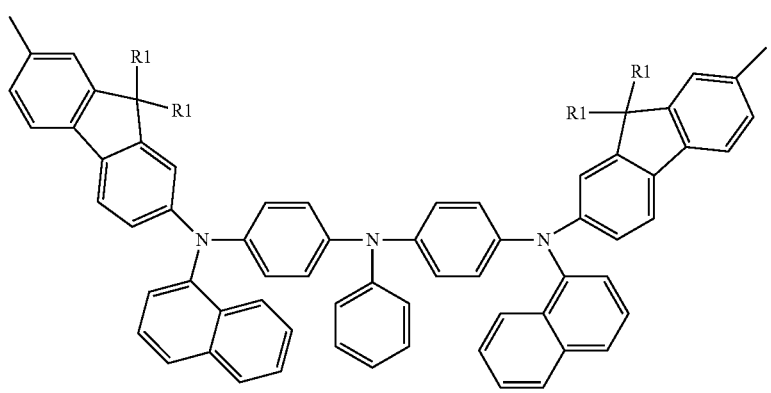
Formula (XXVI)
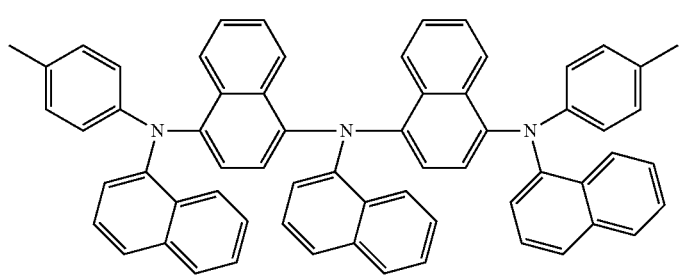
Formula (XXVII)

-continued
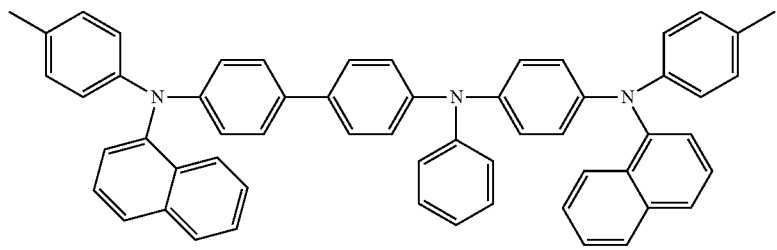
Formula (XXVIII)
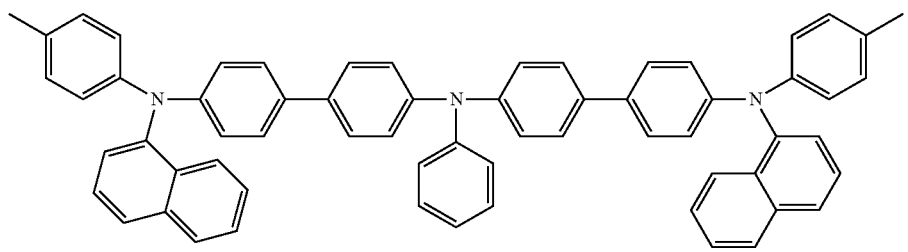
Formula (XXIX)
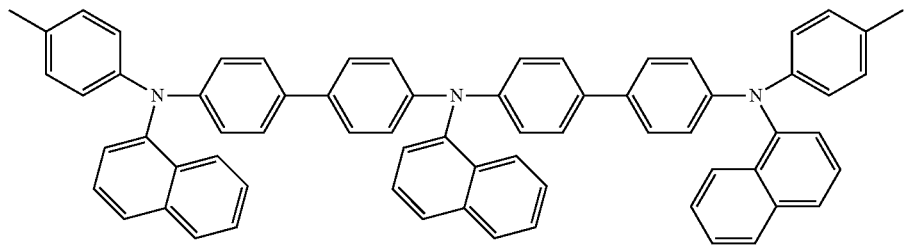
Formula (XXX)
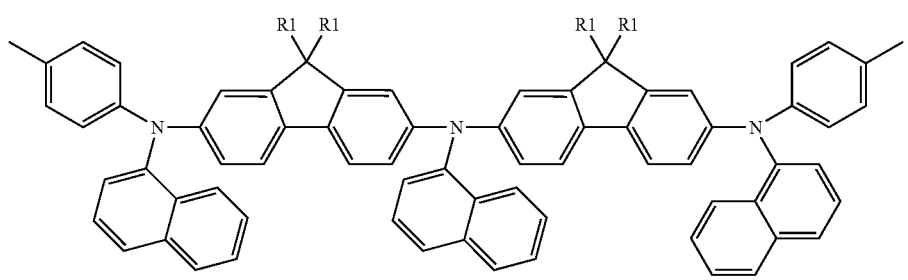
Formula (XXXI)
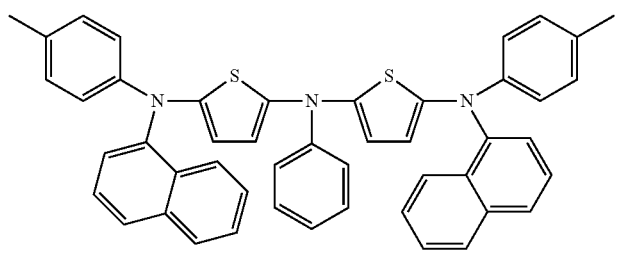
Formula (XXXII)

Formula (XXIII)

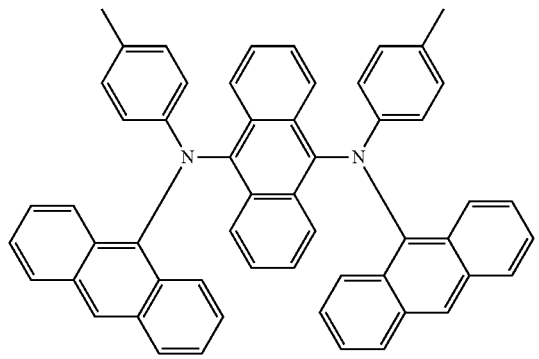

Formula (XXXIV)

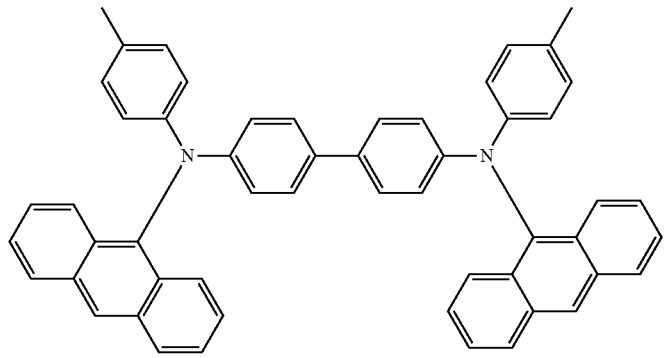

For very particularly preferred structures of the formula (I), the following applies:
$Ar^1$, $Ar^2$, $Ar^3$, $Ar^4$ are the same or different at each instance and are each benzene or fluorene, each of which does not bear any substituents, or fluorene is substituted only at 9 and 9';
Ar-fus is the same or different at each instance and is naphthalene, anthracene or phenanthrene, each of which bears 1 or 2 substituents R1 at the free positions;
$Ar^5$ is the same at each instance as the Ar-fus present in the same unit;
n is the same or different at each instance and is 0 or 1;
m, R1, R2 are analogous to the statements made above.

Even if this is evident from the description, it is stated explicitly once again here that both the structural units of the formula (I) and those of the formulae (II) to (XXXIV) may be substituted unsymmetrically, i.e. different substituents R1 may be present on one unit or they may be bonded to different positions.

The inventive polymers have generally from 10 to 10 000, preferably from 50 to 5000, more preferably from 50 to 2000, repeat units.

The necessary solubility is achieved in particular by the substituents R1, both on the structures of the formula (I) and on those which, as outlined above, are additionally present in corresponding copolymers.

In general, it is therefore necessary that at least 2 nonaromatic carbon atoms are present on average per repeat unit in the substituents. Preference is given to at least 4, particular preference to at least 8, carbon atoms. Individual carbon atoms among these may also be replaced by O or S. This does not rule out that a certain proportion of repeat units, both those of the formula (I) and other structural types, does not contain any further nonaromatic substituents.

In order not to worsen the morphology of the film, preference is given to not having any long-chain substituents having more than 12 carbon atoms in one linear chain, preferably none having more than 8 carbon atoms, more preferably none having more than 6 carbon atoms.

As in the description of R1, nonaromatic carbon atoms are present in corresponding straight-chain, branched or cyclic alkyl or alkoxy chains.

Preference is therefore further given to inventive polymers in which:
R1 is the same or different at each instance and is a straight-chain, branched or cyclic alkyl or alkoxy chain having from 1 to 10 carbon atoms in which one or more hydrogen atoms may also be replaced by fluorine, or an aryl group having from 6 to 14 carbon atoms, each of which may also be substituted by one or more nonaromatic R1 radicals.

Particular preference is therefore further given to inventive polymers in which:
R1 is the same or different at each instance and is a straight-chain or branched alkyl or alkoxy chain having from 1 to 8 carbon atoms, or an aryl group having from 6 to 10 carbon atoms, each of which may also be substituted by one or more nonaromatic R1 radicals.

The inventive polymers thus have the following surprising advantages, among others, over the abovementioned prior art:
the operative lifetime in the case of use in PLEDs is increased for comparable polymers (cf. data in Table 1). As already detailed above, this brings distinct advantages for the application, since the target of generating long-lifetime full-color displays has moved closer.
the efficiency at high illumination densities can be distinctly increased with comparable polymers when they contain structural elements of the formula (I). This can be taken, inter alia, from the data in Table 2.

surprisingly, the use of inventive polymers also has advantages for the generation of blue emission: the emission color can become even deeper (i.e. deep blue) than those for analogous polymers without structural units of the formula (I). (cf. polymers P1 and P3 with polymer C1).

corresponding copolymers can be formed in such a way that they can emit all basic colors (red, green, blue). This is not a direct advantage over prior art polymers; however, it is essential that this property is retained in the inventive polymers.

the solubility in organic solvents is generally good, i.e. in solvents such as toluene, xylene, anisole, methylanisole, methylnaphthalene, the polymers are soluble in amounts within the range of from 1 to approx. 30 g/l (depending on the molecular weight).

The inventive polymers are generally prepared by polymerizing one or more monomers of which at least one gives rise to structures of the formula (I). There are in principle relatively many different corresponding polymerization reactions, but the types listed hereinbelow have been found to be particularly useful. In principle, reaction types (A) to (C) give rise to C—C bonds; reaction type (D) to C—N bonds:

(A) SUZUKI polymerization: in this reaction, the monomers used are firstly bishalides, secondly bisboronic acids and corresponding derivatives or corresponding monohalide-monoboronic acid derivatives, and are coupled under palladium catalysis in the presence of solvents and basic conditions. Such reactions which lead to conjugated polymers have already been described many times. There is a whole series of proposals as to how such reactions can proceed efficiently and lead to high molecular weight polymers; these are detailed, inter alia, in the following references: (i) EP 707.020, (ii) EP 842.208, (iii) EP 1.025.142, (iv) WO 00/53656, (v) WO 03/048225 and (vi) in the references cited therein. The corresponding descriptions are deemed to be part of the application by reference.

(B) YAMAMOTO polymerizations: in this reaction, the monomers used are exclusively bishalides. These are carried out in the presence of solvents, of a nickel compound and optionally of a reducing agent and also further ligands. Such reactions which lead to conjugated polymers have already been described. There are some proposals as to how such reactions can proceed efficiently and lead to high molecular weight polymers; these are detailed, inter alia, in the following references: (i) M. Ueda et al., *Macromolecules*, 1991, 24, 2694, (ii) T. Yamamoto et al., *Macromolecules* 1992, 25, 1214, (iii) T. Yamamoto et al., *Synth. Met.* 1995, 69, 529-31, (iv) T. Yamamoto et al., *J. Organometallic Chem.* 1992, 428, 223, (v) I. Colon et al., *J. Poly. Sci.: Part A: Poly. Chem.* 1990, 28, 367, (vi) T. Yamamoto et al., *Macromol. Chem. Phys.* 1997, 198, 341. (vii) A process which functions efficiently is also described in the application DE 10241814.4 which is yet to be published. The corresponding descriptions are deemed to be part of the application by reference.

(C) STILLE polymerizations: in this reaction, the monomers used are firstly bishalides, secondly bisstannates or corresponding monohalide-monostannates, and are coupled under palladium catalysis in the presence of solvents. Such reactions which lead to conjugated polymers have already been described. However, there have not yet been such extensive elaborations as is the case for the SUZUKI or YAMAMOTO coupling. A conjugated polymer which was obtained by STILLE coupling is described, for example, in W. Schorf et al., *J. Opt. Soc. Am. B* 1998, 15, 889. One overview of the possibilities and the difficulties of the STILLE reaction is given by V. Farina, V. Krishnamurthy, W. J. Scott (eds.) "The Stille Reaction" 1998, publisher: Wiley, New York, N.Y. The corresponding descriptions are deemed to be part of the application by reference.

(D) HARTWIG/BUCHWALD polymerizations or the description in WO 99/12888: in this reaction, the monomers used are firstly bishalides, secondly corresponding bisarylamines (which still have at least one hydrogen atom on the nitrogen) or corresponding monohalide-monoamine compounds, and are coupled under palladium or nickel catalysis in the presence of solvents, basic conditions and specific ligands. Corresponding processes (at least for the low molecular weight variant, but in some cases with description for the generation of polymers) are described, inter alia, in (i) U.S. Pat. No. 5,576,460, (ii) EP 802173, (iii) WO 99/12888.

The actual polymerization (polycondensation) (cf. also the data in the examples) generally proceeds by the monomer(s) being reacted within a suitable concentration range in solution with the corresponding catalysts and auxiliary systems. It may be advantageous to carry out a molecular weight limitation by slight deviations from the ideal stoichiometry or by the presence of small amounts of monofunctional compounds. The reaction is generally carried out up to the desired molecular weight (process control may be effected, for example, via viscosity measurement). Afterward, the reaction is terminated. This can be done in various ways. It has been found useful to avoid reactive end groups by carrying out what is known as an end-capping, i.e. to add monofunctional compounds after attainment of the desired molecular weight. In the case of the reaction types A, C and D, this may also be effected twice, i.e. one or more monofunctional compound(s) first of one type (for example monohalide), and then of the other type (for example monoboronic acid derivative) is added.

Afterward, the synthesized polymers first have to be-removed from the reaction medium. This is generally effected by precipitating in a nonsolvent. Subsequently, the resultant polymers have to be purified, since it is precisely the content of organic low molecular weight impurities and also the ion content or content of other inorganic impurities that can sometimes have very great effects on the performance properties of the polymers in PLEDs or else other applications. For instance, low molecular weight constituents can firstly considerably lower the efficiency, but also dramatically worsen the operative lifetime (for example as result of diffusion during operation). The same applies to the presence of inorganic impurities.

Suitable purification processes are firstly precipitation operations in which the polymer is dissolved and precipitated in a nonsolvent repeatedly. In this operation, it is sensible to pass the polymer solution through a filter in order to remove it from undissolved constituents (crosslinked gel particles) and also dust particles. A further possibility is the use of ion exchangers in order to reduce the content of ions. In this case, the extractive stirring of a polymer solution with an aqueous solution which contains, for example, chelating ligands may also be helpful. Further organic or inorganic extraction processes, for example with solvent/nonsolvent mixtures or with supercritical $CO_2$, may also bring distinct advantages here.

In order to be able to prepare the corresponding inventive polymers, for example by the abovementioned process, the corresponding monomers, as described, are required.

For structures of the formula (I), these may be obtained, for example, as described below:

corresponding aromatic tri(hetero)arylamines are in principle always preparable according to the above already under the polymerization description (point D) and the sources cited therein, i.e. more complex structures can be formed from relatively simple amines and corresponding haloaromatics.

a corresponding functionalization which enables use as monomers (i.e. for example halogen end groups) may be effected either actually before the preparation of the corresponding compound of the formula (I) on the precursors or as the last step on the already fully formed backbone. Depending on the desired target structure, both variants have both advantages and disadvantages.

the functionalities may already be present beforehand when they react either not at all or in a very hindered manner in the coupling to give the corresponding monomer of the formula (I). This may, for example, be the case when different reactivities (for example iodine relative to bromine or bromine relative to chlorine) can be exploited. For example, monomers for the structural formulae (II) to (IX) can be prepared utilizing this selectivity, as outlined below for a simple example of (II): when 4,4'-dibromodiphenylamine is reacted with 1-iodonaphthalene under ULLMANN conditions (cf. H. Kageyama et al., *J. Mater. Chem.* 1996, 6, 675-676), the corresponding bis(4-bromophenyl)naphthylamine is obtained in good yields and purities.

analogously, many monomers of the structural formulae (X) to (XXII), and also (XXIII) to (XXXIV) over several steps, can also be formed.

on the other hand, it may also be advantageous (in the case, for example, of existing substitution or directing radicals) initially to form the arylamine basic structure and to introduce the halide in a last step. For example, it is possible for structures of the formula (XVI) to introduce bromine into the particular 4- and 4'-positions of the phenyl (by mild NBS bromination; cf. for example Creason et al., *J. org. Chem*, 1972, 37, 4440) when a substituent is present in each case in the 4-position of the naphthalene radicals. As outlined above, this process, in the presence (i) of corresponding blocking substituents, (ii) corresponding directing radicals or (iii) activated or deactivated heterocycles may also be employed for further structures of the formula (I) in general and of the formulae (II) to (XXXII) specifically.

starting from the thus generated halide derivatives, corresponding bisboronic acid derivatives or bisstannane derivatives (which are required for the abovementioned type A and C polymerization processes) are prepared by standard processes. These processes are sufficiently well known to those skilled in the art and consist generally in exchanging the halogen present for a metal (for example magnesium, lithium) and then reacting it with a boron ester compound or a trialkyltin-halogen compound. For the preparation of boronic acid derivatives, catalytic processes for directly reacting the halides with, for example, diboranes in the presence of palladium are also known. Corresponding monohalide-monoboronic acid derivative and monohalide-monostannate compounds are also obtainable in suitable stoichiometry.

for reactions according to polymerization type (D), a portion of the polymers does not require any halogen functionality, but rather only secondary amine functionalities. These are simple to obtain by the abovementioned synthetic methods.

The synthesis of the further monomers which lead to structures which do not correspond to those of the formula (I) but have been described above is described comprehensively in the applications and patents already mentioned above. A good overview on this subject is given by the application WO 02/077060; the corresponding remarks made there are considered to be part of this application by reference.

The thus obtained inventive polymers can be used in PLEDs. In general, the following general process is used and has to be adapted correspondingly to the individual case:

A substrate (for example glass or else a plastic such as specially treated PET) is coated with a transparent anode material (for example indium tin oxide, ITO); subsequently, the anode is structured and connected in a circuit (for example photolithographically) in accordance with the desired application. It may even be the case here that the whole substrate and the corresponding circuit are first generated by quite a complicated process in order thus to enable active matrix control.

Subsequently, either over the full surface or only on the active (anodic) sites, a conductive polymer, for example a doped polythiophene or polyaniline derivative, is generally initially applied. This is generally effected by coating processes which apply a dispersion of the corresponding polymer. For this purpose, the processes described for the light-emitting polymer below are suitable in principle. The layer thickness of this polymer layer may vary within wide ranges, but will be in the range between 10 and 1000 nm, preferably between 20 and 500 nm, for practical use.

Depending on the application, a solution of an inventive polymer is applied thereto. For multicolor or full-color display elements, several different solutions are applied in different regions in order to obtain corresponding colors.

To this end, the inventive polymers are initially dissolved individually (it may also be recommended to use blends of two or more polymers) in a solvent or solvent mixture and finally filtered. Since the organic polymers and in particular the intermediate layers (interface) in the PLED are influenced, in some cases to an extreme extent, by oxygen or other air constituents, it is recommended to carry out this operation under protective gas. Suitable solvents are aromatic liquids, for example toluene, xylenes, anisole, chlorobenzene, but also others, for example cyclic ethers (e.g. dioxane, methyldioxane) or else amides, for example NMP or DMF, but also solvent mixtures as described in the application WO 02/072714.

It is possible using these solutions to coat the supports described above, either over the whole surface, for example by spincoating processes or knifecoating techniques, or else with local resolution by printing processes such as inkjet printing, offset printing, screen printing processes, gravure printing processes and the like.

It is possible to apply optional further electron injection materials to these polymer layers, for example by vapor deposition, or else from solution by methods as have been described for emitting polymers. The electron injection materials used may, for example, be low molecular weight compounds such as triarylborane compounds or else aluminum trishydroxyquinolinate (Alq$_3$), but also corresponding polymers, for example polypyridine derivatives and the like. It is also possible to convert thin layers of the emitting polymer to electron injection layers by corresponding doping.

Thereafter, a cathode is applied by vapor deposition. This is generally effected by a vacuum process and may be accomplished, for example, either by thermal vapor deposition or by plasma spraying (sputtering). The cathode may be applied over the full surface or else structured through a mask. The cathodes used are generally metals having a low work function, for example alkali metals, alkaline earth metals and f-transition metals, for example Li, Ca, Mg, Sr, Ba, Yb, Sm or else aluminum, or else alloys of metals, or else multilayer structures comprising different metals. In the latter case, it is also possible to use metals which have a relatively high work function, for example Ag. It may also be preferred to introduce a very thin dielectric layer (for example LiF or the like) between the metal and the emitting polymer or the electron injection layer. The cathodes are generally between 10 and 10 000 nm thick, preferably between 20 and 1000 nm thick.

Subsequently, the thus obtained PLEDs or displays are appropriately connected and encapsulated in order then to be tested or used.

As described above, the inventive polymers are suitable very particularly as electroluminescent materials in the PLEDs or displays produced in this way.

In the context of the invention, electroluminescent materials are regarded as being materials which can find use as the active layer in a PLED. Active layer means that the layer is capable of emitting light on application of an electrical field (light-emitting layer) and/or that it improves the injection and/or the transport of the positive and/or negative charges (charge injection or charge transport layer).

The invention therefore also provides the use of an inventive polymer in a PLED, especially as an electroluminescent material.

The invention thus likewise provides a PLED having one or more active layers, at least one of these active layers comprising one or more inventive polymers. The active layer may, for example, be a light-emitting layer and/or a transport layer and/or a charge injection layer.

PLEDs find use, for example, as self-illuminating display elements such as control lamps, alphanumeric displays, multicolor or full-color displays, information signs, and in optoelectronic couplers.

In the present application text and also in the examples which follow below, the aim is the use of inventive polymers or blends of inventive polymers in relation to PLEDs and the corresponding displays. In spite of this restriction of the description, it is possible for those skilled in the art without further inventive activity also to utilize the inventive polymers in other electronic devices, for example for organic integrated circuits (O-ICs), in organic field-effect transistors (OFETs), in organic thin-film transistors (OTFTs), for organic solar cells (O-SCs) or else organic laser diodes (O-laser), to name just a few applications. Specifically for O-ICs and OFETs, corresponding inventive polymers which have a relatively high content of structural elements of the formula (I) (preferably a content of more than 20%) may find use.

The invention is illustrated in detail by the examples which follow without any intention that it be restricted thereto.

EXAMPLES

Part A: Synthesis of the Monomers

A1: Monomers for Units of the Formula (I)
A1.1 Synthesis of Inventive Monomer 1 (IM 1)

Preparation of
4-bromo-1-(pentamethylphenyl)naphthalene 10 ml (100 mmol) of $Br_2$ were added dropwise at a temperature of 5° C. to a solution of 25 g (91 mmol) of 1-pentamethylphenylnaphthalene in 500 ml of $CHCl_3$ within 15 min and the reaction mixture was stirred at RT for 6 h. Subsequently, 100 ml of sat. $Na_2SO_3$ solution were added, and the organic phase was removed, washed with $NaHCO_3$ solution and dried over $Na_2SO_4$. The solid remaining after the solvent had been removed was recrystallized from n-heptane. 27.3 g (85%) of colorless crystals were obtained.

$^1$H NMR ($d_6$-DMSO): [ppm]=8.21 (d, $^3J_{HH}$=8.4 Hz, 1H), 7.95 (d, $^3J_{HH}$=7.7 Hz, 1H), 7.68 (t, $^3J_{HH}$=6.7 Hz, 1H), 7.51 (t, $^3J_{HH}$=6.7 Hz, 1H), 7.24 (d, $^3J_{HH}$=8.0 Hz), 7.1 (d, $^3J_{HH}$=7.7 Hz), 2.28 (s, 3 h), 2.21 (s, 6H), 1.69 (s, 6H).

Preparation of N,N'-diphenyl-N,N'-bis-1-(4-pentamethylphenyl)naphthylbiphenyl-4,4'-diamine 90 mg (0.4 mmol) of $Pd(OAc)_2$, 165 mg (0.8 mmol) of $P(^tBu)_3$ and 11.05 g (115 mmol) of $NaO^tBu$ were added successively against an Ar flow to an $N_2$-saturated solution of N,N'-diphenylbenzidine (13 g, 39 mmol) and 29 g (82 mmol) of 4-bromo-1-(pentamethylphenyl)naphthalene in 175 ml of dry toluene, and the mixture was subsequently heated to reflux for 2 h. After this time, the mixture was cooled to RT and 20 ml of 1% NaCN solution were added dropwise, the mixture was stirred for a further 4 h and the resultant precipitate was filtered off with suction, washed with $H_2O$ and MeOH, dried and recrystallized three times from chlorobenzene. 18.2 g (53%) of the product remained in the form of a white powder with a purity of 99.8% (HPLC).

$^1$H NMR ($CDCl_3$): [ppm]=7.96 (d, $^3J_{HH}$=8.0 Hz, 2H), 7.52 (d, $^3J_{HH}$=8.7 Hz, 4H), 7.45 (d, $^3J_{HH}$=7.4 Hz, 2H), 7.38 (m, 4H), 7.27 (m, 8H), 7.01 (m, 10H), 2.29 (s, 6H), 2.23 (s, 12H), 1.78 (s, 12H).

Preparation of N,N'-bis-(4-bromophenyl)-N,N'-bis-1-(4-pentamethylphenyl)naphthyl-biphenyl-4,4'-diamine (IM 1)

16.3 g (18.5 mmol) of N,N'-diphenyl-N,N'-bis-1-(4-pentamethylphenyl)naphthylbiphenyl-4,4'-diamine were dissolved in 150 ml of $CHCl_3$ and admixed with exclusion of air and water at 0° C. with 7.3 g of NBS (41 mmol) and 92 mg (0.6 mmol) of anhydrous $FeCl_3$. After 5 min, the reaction was stopped with 20 ml of MeOH and the suspension was filtered, the residue was stirred with water and MeOH, and the colorless solid was recrystallized four times from toluene. The bisbromide was obtained as a colorless powder (13 g, 68%) with a purity of >99.8% (HPLC).

$^1$H NMR ($d_6$-DMSO): [ppm]=7.93 (d, $^3J_{HH}$=8.0 Hz, 2H), 7.55 (d, $^3J_{HH}$=8.7 Hz, 4H), 7.42 (m, 10H), 7.26 (t, $^3J_{HH}$=6.0 Hz, 4H), 7.07 (d, $^3J_{HH}$=8.7 Hz, 4H), 6.92 (d, $^3J_{HH}$=9.0 Hz, 4H), 2.29 (s, 6H), 2.26 (s, 12H), 1.77 (s, 12H).

A1.2 Synthesis of Inventive Monomer 2 (IM 2)

Preparation of N,N'-diphenyl-N,N'-bis(4-methylnaphthyl)biphenyl-4,4'-diamine 78 mg (0.35 mmol) of $Pd(OAc)_2$, 137 mg (0.68 mmol) of $P(^tBu)_3$ and 9.28 g (96.5 mmol) of $NaO^tBu$ were added successively against an Ar flow to an $N_2$-saturated solution of N,N'-diphenylbenzidine (11.5 g, 34.3 mmol) and 15.5 g (69 mmol) of 4-bromomethylnaphthalene in 150 ml of dry toluene, and the mixture was subsequently heated to reflux for 2 h. After this time, the mixture was cooled to RT and 15 ml of 1% NaCN solution were added dropwise, the mixture was stirred for a further 4 h and the resulting precipitate was filtered off with suction, washed with $H_2O$ and MeOH, dried and recrystallized twice from toluene. 18.6 g (88%) of the product remained in the form of a colorless powder with a purity of 99.6% (HPLC).

$^1$H NMR (CDCl$_3$): [ppm]=8.0 (2 d, $^3J_{HH}$=8.4 Hz, $^3J_{HH}$=8.7 Hz, 4H), 7.49 (t, $^3J_{HH}$=7.7 Hz, 4H), 7.35 (m, 8H), 7.23 (m, 2H), 7.18 (t, $^3J_{HH}$=8.0 Hz, 4H), 7.04 (t, $^3J_{HH}$=9.0 Hz, 8H), 6.9 (t, $^3J_{HH}$=7.3 Hz, 2H), 2.71 (s, 6H).

Preparation of N,N'-bis-(4-bromophenyl)-N,N'-bis(4-methylnaphthyl)biphenyl-4,4'-diamine (IM 2)

15.8 g (25.6 mmol) of N,N'-diphenyl-N,N'-bis(4-methylnaphthyl)biphenyl-4,4'-diamine were dissolved in 200 ml of CHCl$_3$ and 9.4 g (51.2 mmol) of NBS and 132 mg (0.9 mmol) of FeCl$_3$ were added at 0° C. with exclusion of water and air. After 5 min, the reaction was stopped by adding 50 ml of MeOH, the precipitate was filtered off with suction, washed with H$_2$O and MeOH, and recrystallized five times from toluene. 14 g (71%) of a colorless powder were obtained which had a content of 99.9% by HPLC.

$^1$H NMR (d$_6$-DMSO): [ppm]=8.08 (d, $^3J_{HH}$=8.4 Hz, 2H), 7.86 ($^3J_{HH}$=8.4 Hz, 2H), 7.57 (t, $^3J_{HH}$=7.7 Hz, 2H), 7.45 (m, 8H), 7.35 (d, $^3J_{HH}$=8.7 Hz, 4H), 7.30 ($^3J_{HH}$=7.4 Hz, 2H), 7.05 (d, $^3J_{HH}$=8.7 Hz, 4H), 6.83 ($^3J_{HH}$=8.7 Hz, 4H), 2.68 (s, 6H).

A1.3 Synthesis of an Inventive Monomer 3 (IM 3)

Preparation of N,N'-diphenyl-N,N'-bis(4-methylnaphthyl)anthracene-9,10-diamine 90 mg (0.4 mmol) of Pd(OAc)$_2$, 165 mg (0.8 mmol) of P($^t$Bu)$_3$ and 11.05 g (115 mmol) of NaO$^t$Bu were added successively against an Ar flow to an N$_2$-saturated solution of N-phenyl-N-(4-methylnaphthyl)amine (19.1 g, 82 mmol) and 13.1 g (39 mmol) of 9,10-dibromoanthracene in 175 ml of dry toluene, and the mixture was subsequently heated to reflux for 4 h. After this time, the mixture was cooled to RT and 20 ml of 1% NaCN solution were added dropwise, the mixture was stirred for a further 4 h and the resulting precipitate was filtered off with suction, washed with H$_2$O and MeOH, dried and recrystallized four times from toluene/heptane. The yield was 24 g (77%) of the product in the form of a colorless powder with a purity of 99.7% (HPLC).

$^1$H NMR (d$_6$ DMSO): [ppm]=8.08 (d, $^3J_{HH}$=8.7 Hz, 2H), 7.90 (d, $^3J_{HH}$=8.0 Hz, 2H), 7.58 (m, 4H), 7.33 (m, 4H), 7.56 (t, $^3J_{HH}$=8.0 Hz, 2H), 7.44 (m, 4H), 7.28 (d, $^3J_{HH}$=7.4 Hz, 2H), 6.94 (m, 10H), 2.68 (s, 6H).

Preparation of N,N'-(4-bromophenyl)-N,N'-bis(4-methylnaphthyl)anthracene-9,10-diamine (IM 3)

16.4 g (25.6 mmol) of N,N'-diphenyl-N,N'-bis(4-methylnaphthyl)anthracene-9,10-diamine were dissolved in 200 ml of CHCl$_3$ and 9.4 g (51.2 mmol) of NBS and 132 mg (0.9 mmol) of FeCl$_3$ were added at 0° C. with exclusion of water and air. After 5 min, the reaction was stopped by adding 50 ml of MeOH, the precipitate was filtered off with suction, washed with H$_2$O and MeOH and recrystallized six times from toluene/ethanol. 11.3 g (55%) of a colorless powder remained and had a content of 99.9% by HPLC.

$^1$H NMR (d$_6$-DMSO): [ppm]=8.08 (d, $^3J_{HH}$=8.4 Hz, 2H), 7.86 ($^3J_{HH}$=8.4 Hz, 2H), 7.59 (m, 4H), 7.34 (m, 4H), 7.57 (t, $^3J_{HH}$=7.7 Hz, 2H), 7.45 (m, 4H), 7.30 ($^3J_{HH}$=7.4 Hz, 2H), 7.05 (d, $^3J_{HH}$=8.7 Hz, 4H), 6.83 ($^3J_{HH}$=8.7 Hz, 4H), 2.68 (s, 6H).

A2: Monomers for Further Units

The synthesis of the further monomers M1 to M23 has already been described in detail in WO 02/077060 and the literature cited therein. For better clarity, the monomers are illustrated once again below:

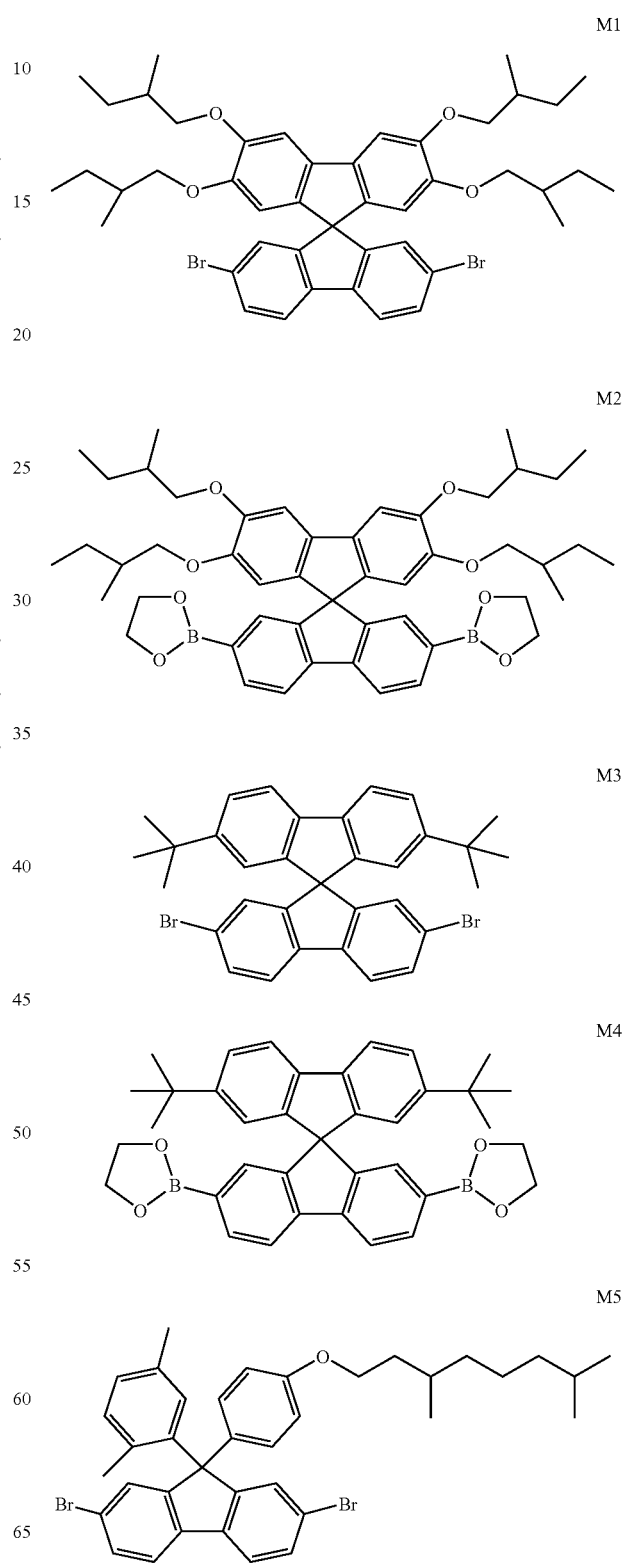

M6
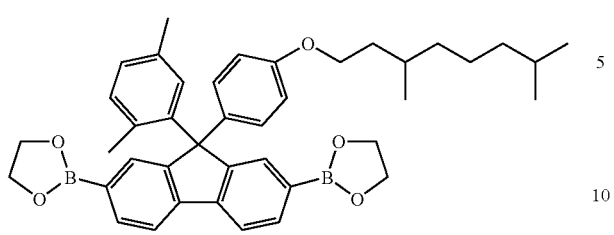
M7
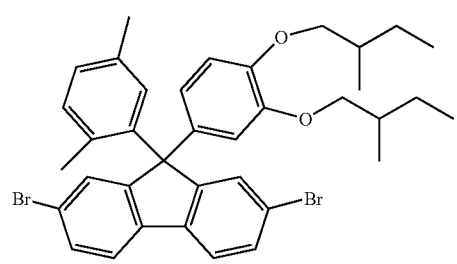
M8
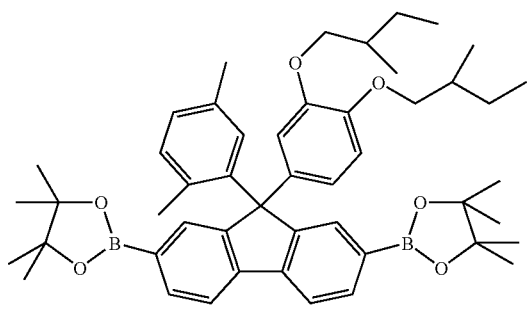
M9
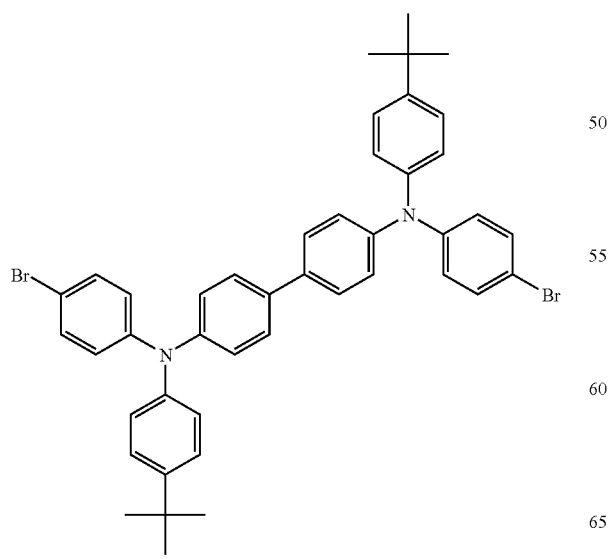
M10
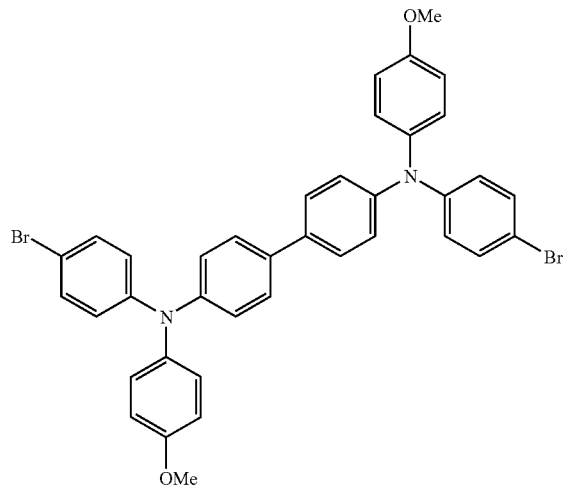
M11
M12
M13
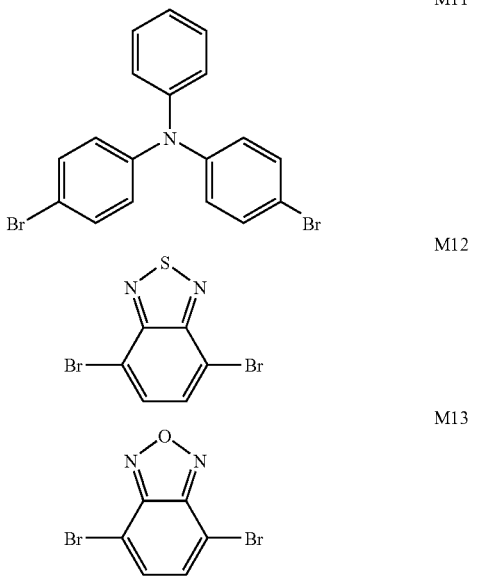
M14
M15
M16
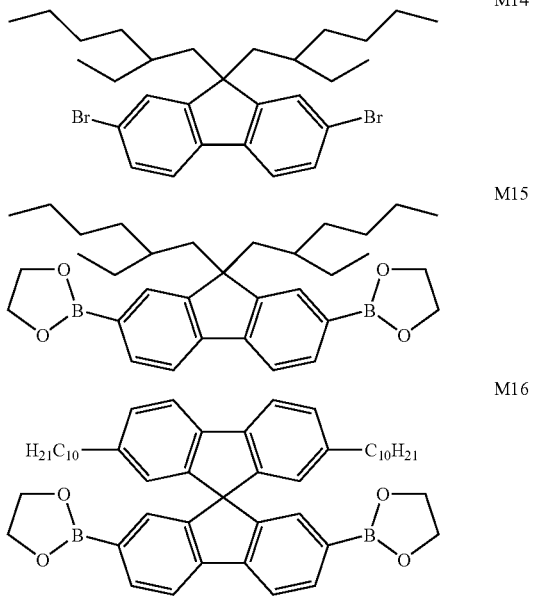

M17

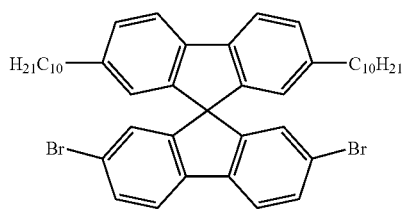

M18

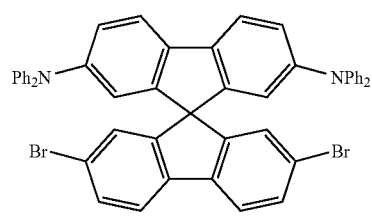

M19

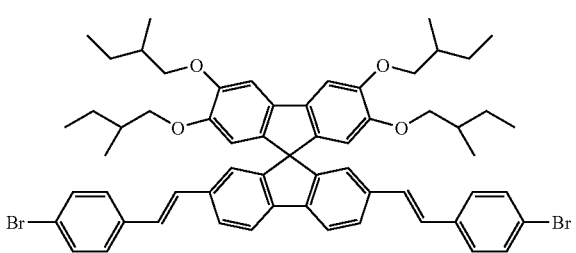

M20

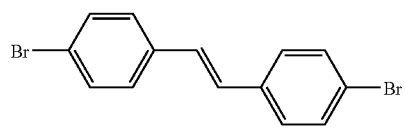

M21

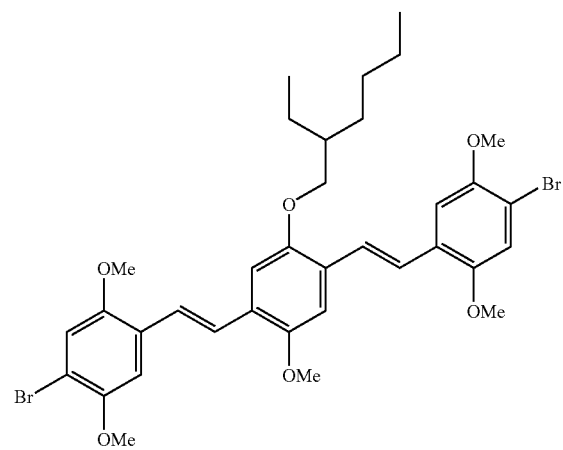

M22

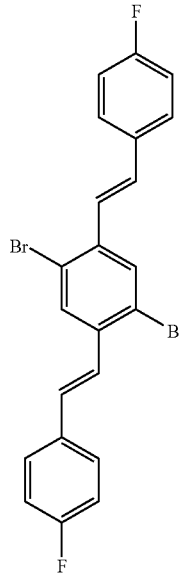

M23

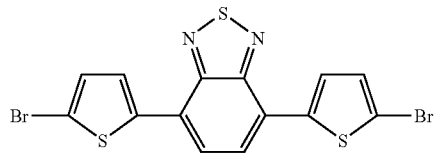

Part B: Preparation of the Polymers

Synthesis of Polymer P1:

1.6103 g (2 mmol) of monomer M2, 1.0825 g (1.6 mmol) of monomer M7, 0.3098 g (0.4 mmol) of monomer IM2 and 1.96 g (2.125 equivalents) of potassium phosphate hydrate were dissolved in 19 ml of dioxane, 7 ml of toluene and 3.4 ml of $H_2O$ (all solvents oxygen-free). The reaction solution was degassed with argon for 30 minutes. Then, 0.22 mg (0.025%) of $Pd(OAc)_2$ and 1.83 mg (0.15%) of $P(o-tolyl)_3$ were added as a catalyst, and the solution was heated under reflux under an argon atmosphere for 2.5 h. The highly viscous polymer solution was diluted with 15 ml of dioxane and 35 ml of toluene. The end-capping was then carried out by adding 0.1 ml of bromobenzene and 100 ml of toluene, heating the mixture under reflux for 30 minutes, then adding 200 mg of benzeneboronic acid and 40 ml of toluene, and heating under reflux for 30 minutes. The polymer solution was stirred at 60° C. with 100 ml of 0.01% aqueous NaCN solution for 3 h. The phases were then separated, and the organic phase washed with 4×100 ml of $H_2O$. The polymer was precipitated by adding double the volume of methanol and filtered. Further purification was effected by dissolving in 200 ml of toluene and 200 ml of THF at 60° C. under argon, filtration through a glass frit and precipitating again by adding double the volume of methanol. The polymer was filtered and dried under reduced pressure. 1.98 g (81% of theory) of polymer were isolated, Mw=1 300 000, Mn=293 000, polydispersity=4.4.

Synthesis of Polymer P2:

3.1706 g (4 mmol) of monomer M2, 1.6237 g (3.2 mmol) of monomer M7, 0.8185 g (0.8 mmol) of monomer M19, 0.8312 g (0.8 mmol) of monomer IM1 and 3.91 g (2.125 equivalents) of potassium phosphate hydrate were dissolved in 37.5 ml of dioxane, 12 ml of toluene and 6.8 ml of $H_2O$ (all solvents oxygen-free). The reaction solution was degassed with argon for 30 minutes. Then, 0.45 mg (0.025%) of $Pd(OAc)_2$ and 3.65 mg (0.15%) of $P(o\text{-toyl})_3$ were added as a catalyst, and the solution was heated under reflux under an argon atmosphere for 2 h. The viscous polymer solution was diluted with 50 ml of toluene. The end-capping was then carried out by adding first 100 mg of benzeneboronic acid and, after a further hour of reflux, 0.1 ml of bromobenzene. The polymer solution was stirred at 60° C. with 100 ml of 0.01% aqueous NaCN solution for 3 h. The phases were then separated and the organic phase was washed with 3×100 ml of $H_2O$. The organic phase was diluted with toluene to four times the volume and precipitated by adding twice the amount of MeOH and filtered. Further purification was effected by dissolving in 200 ml of THF at 60° C. under argon, filtering through a glass frit and precipitating again by adding double the volume of methanol. The polymer was filtered and dried under reduced pressure. 4.23 g (79% of theory) of polymer were isolated.

$M_w$=545 000, $M_n$=193 000; polydispersity=2.8.

Further polymers were prepared analogously to the descriptions for P1 and P2. The chemical properties are summarized in the table which follows. Some comparative polymers (which do not contain any units of the formula (I)) were also prepared. These are also listed in the table. All of these polymers were also investigated for use in PLEDs. How PLEDs can be produced is firstly already detailed above and is also described in more detail in part C.

The most important device properties (color, efficiency and lifetime) are also listed in Table 1.

The lifetime reported here relates to what is known as the LT50 value, i.e. the time which lapses before the corresponding PLED only has 50% of the starting brightness.

In Table 2, the performance at relatively high illumination densities is documented. It can be seen very readily here that the fall in the efficiency at relatively high illumination densities is distinctly smaller in the case of the inventive polymers than in the case of the prior art comparative polymers.

TABLE 2-continued

| | Efficiency (Cd/A) at a brightness of . . . | | | | |
|---|---|---|---|---|---|
| Polymer | 100 Cd/m² | 200 Cd/m² | 1000 Cd/m² | 10000 Cd/m² | 30000 Cd/m² |
| C1 | 3.0 | 3.5 | 2.5 | 2.0 | 1.5 |
| C2 | 5.0 | 5.2 | 4.3 | 3.3 | 2.6 |

Pulse conditions: the measurements were carried out with a duty cycle of 1:100 and a frequency of 100 Hz.

Part C: Production and Characterization of LEDs

LEDs were produced by the general process outlined below. This had to be adapted in the individual case to the particular circumstances (for example polymer viscosity and optimal layer thickness of the polymer in the device). The LEDs described below were in each case two-layer systems, i.e. substrate//ITO//PEDOT//polymer//cathode. PEDOT is a polythiophene derivative.

General Process for Producing High-Efficiency, Long-Lifetime LEDs:

After the ITO-coated substrates (for example glass supports, PET films) have been cut to the correct size, they are cleaned in an ultrasound bath in several cleaning steps (for example soap solution, Millipore water, isopropanol).

For drying, they are blown with an $N_2$ gun and stored in a dessicator. Before they are coated with the polymer, they are treated with an ozone plasma unit for approx. 20 minutes. A solution of the particular polymer (generally having a concentration of 4-25 mg/ml in, for example, toluene, chlorobenzene, xylene: cyclohexanone (4:1)) is prepared and dissolved at room temperature by stirring. Depending on the polymer, it may also be advantageous to stir at 50-70° C. for a certain time. When the polymer has dissolved fully, it is filtered through a 5 μm filter and applied by spin coating with a spin coater at variable speeds (400-6000). It is thus possible to vary the layer thicknesses in the range of from approx. 50 to 300 nm. Beforehand, a conductive polymer, preferably doped PEDOT or PANI, is usually applied to the (structured) ITO.

Electrodes are also applied to the polymer films. This is generally effected by thermal vapor deposition (Balzer BA360 or Pfeiffer PL S 500). Subsequently, the transparent ITO electrode is contacted as the anode and the metal electrode (for example Ba, Yb, Ca) as the cathode, and the device parameters are determined. The results obtained with the polymers described are summarized in the tables in part B.

TABLE 1

| Polymer (Type)* | Proportion of the monomers in the polymerization [%] | | | | GPC** | | Electroluminescence*** | | | | Viscosity |
| | Monom.1 | Monom.2 | Monom.3 | Monom.4 | $M_W$ (1000 g/mol) | $M_N$ (1000 g/mol) | $\lambda_{max}$ [nm] | Max. Eff. [Cd/A] | Voltage at 100 Cd/m² [V] | Lifetime @ 100 Cd/m² [hours] | Gel temperature [° C.] |
|---|---|---|---|---|---|---|---|---|---|---|---|
| P1 (S) | 50% M2 | 40% M7 | 10% EM2 | | 1300 | 293 | 449 | 2.95 | 4.3 | 450 | <0° C. |
| P2 (S) | 50% M2 | 30% M7 | 10% M19 | 10% EM1 | 545 | 193 | 459/484 | 5.27 | 3.6 | 2500 | <0° C. |
| P3 (S) | 50% M2 | 40% M1 | 10% EM1 | | 631 | 164 | 449 | 2.23 | 4.7 | 600 | <0° C. |
| C1 (S) | 50% M2 | 40% M7 | 10% M9 | | 1190 | 199 | 464 | 3.42 | 4.9 | 400 | <0° C. |
| C2 (S) | 50% M2 | 40% M7 | 10% M19 | 10% M9 | 464 | 126 | 459/484 | 5.31 | 4.2 | 1800 | <0° C. |

*S = prepared by Suzuki polymerization (cf. Ex. P1), Y = prepared by Yamamoto polymerization
**GPC measurements: THF; 1 ml/min, Plgel 10 μm Mixed-B 2 × 300 × 7.5 mm², 35° C., RI detection was against polystyrene
***for the preparation of the polymer LED, see Part C.
****solutions of the polymer (10 mg/ml) in toluene were heated to 60° C. and cooled at 1° C./minute, and the viscosity was determined using a Brookfield LVDV-III rheometer (CP-41) measured. At the gel temperature determined in this way, a marked rise in the viscosity occurred.

TABLE 2

| | Efficiency (Cd/A) at a brightness of . . . | | | | |
|---|---|---|---|---|---|
| Polymer | 100 Cd/m² | 200 Cd/m² | 1000 Cd/m² | 10000 Cd/m² | 30000 Cd/m² |
| P1 | 2.8 | 2.9 | 3.1 | 2.8 | 2.4 |
| P2 | 4.8 | 5.0 | 4.8 | 4.0 | 3.5 |

What is claimed is:

1. A conjugated polymer containing at least 1 mol % of units of the formula (I)

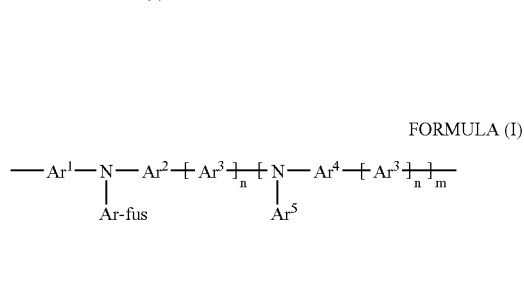

FORMULA (I)

where the symbols and indices are each defined as follows:

Ar¹ and Ar³ are the same or different at each instance and are each an aromatic or heteroaromatic ring system which has from 2 to 40 carbon atoms and are optionally substituted or else unsubstituted; the possible substituents R1 are optionally at any free position;

Ar² and Ar⁴ are the same or different at each instance and are each Ar¹, Ar³ or a substituted or unsubstituted stilbenzylene or tolanylene unit;

Ar-fus is the same or different at each instance and is an aromatic or heteroaromatic ring system which has at least 9 but at most 40 atoms carbon or heteroatoms in the conjugated system which is optionally substituted or else unsubstituted and which consists of at least two fused rings; the possible substituents R1 is optionally at any free position;

Ar⁵ is the same or different at each instance and is either an aromatic or heteroaromatic ring system which has from 2 to 40 carbon atoms and are optionally substituted or else unsubstituted, or Ar-fus; the possible substituents are optionally at any free position;

m and n are the same or different at each instance and are each 0, 1 or 2;

R1 is the same or different at each instance and is a straight-chain, branched or cyclic alkyl or alkoxy chain having from 1 to 22 carbon atoms in which one or more nonadjacent carbon atoms are optionally replaced by N—R2, O, S, —CO—O—, O—CO—O and one or more hydrogen atoms are optionally replaced by fluorine, an aryl or aryloxy group having from 5 to 40 carbon atoms in which one or more carbon atoms are optionally replaced by O, S or N and which may also be substituted by one or more nonaromatic R1 radicals, or Cl, F, CN, N(R2)₂, B(R2)₂, and two or more R1 radicals together optionally form a ring system;

R2 is the same or different at each instance and is H, a straight-chain, branched or cyclic alkyl chain having from 1 to 22 carbon atoms in which one or more nonadjacent carbon atoms are optionally replaced by O, S, —CO—O—, O—CO—O and one or more hydrogen atoms is optionally replaced by fluorine, an aryl group having from 5 to 40 carbon atoms in which one or more carbon atoms are optionally replaced by O, S or N and which are optionally substituted by one or more nonaromatic R1 radicals, with the proviso that the units according to the structures (1) to (3)

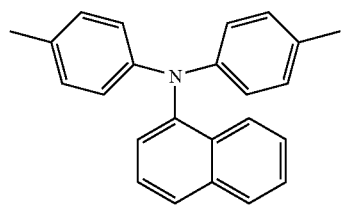

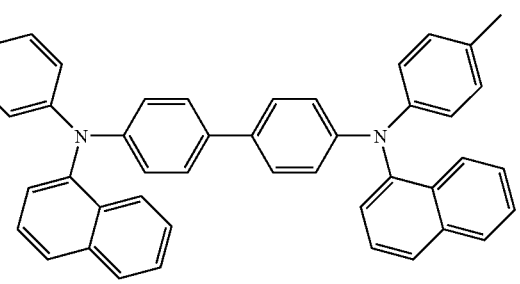

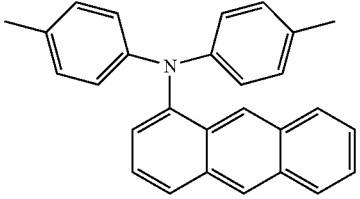

are excluded when the conjugated polymer contains metal complexes which enable a transfer of singlet excitons to triplet excitons and with the proviso that the polymer does not contain fluorene units and wherein the polymer contains further structural elements and said further structural elements are meta-phenylenes, 1,4-naphthylenes, 9,10-anthracenylenes, 2,7-phenanthrenylenes, 1,6-pyrenylenes, 2,7-pyrenylenes, 4,9-pyrenylenes, 2,7-tetrahydropyrenylenes, oxadiazolylenes, 2,5-thiophenylenes, 2,5-pyrrolylenes, 2,5-furanylenes, 2,5-pyridylenes, 2,5-pyrimidinylenes, 3,6- or 2,7-carbazolylenes, 5,8-quinolinylenes, spiro-9,9'-bifluorenylenes, indenofluorenylenes, stilbenzylenes, tolanylenes, bisstyrylarylenes, bis(arylacetylene) arylenes, chrysenes, naphthacenes, pentacenes, perylenes, coronenes, metal complexes which enable a transfer of singlet excitons to triplet excitons and which emit light from the triplet state, arylene-acetylene structures or larger aromatic units.

2. The polymer as claimed in claim 1, wherein the further structural elements are 1,4-naphthylenes, 9,10-anthracenylenes, 2,7-phenanthrenylenes, 1,6- or 2,7- or 4,9-pyrenylenes or 2,7-tetrahydropyrenylenes, oxadiazolylenes, 2,5-thiophenylenes, 2,5-pyrrolylenes, 2,5-furanylenes, 2,5-pyridylenes, 2,5-pyrimidinylenes, 3,6- or 2,7-carbazolylenes, 5,8-quinolinylenes, fluorenylenes, spiro-9,9'-bifluorenylenes, or indenofluorenylenes.

3. The polymer as claimed in claim 1, wherein the further structural elements are arylene-acetylene structures or larger aromatic units.

4. The polymer as claimed in claim 1, wherein the further structural elements are metal complexes which enable a transfer of singlet excitons to triplet excitons and which emit light from the triplet state.

5. The polymer as claimed in claim 4, wherein the further structural elements contain d- and f-transition metals.

6. The polymer as claimed in claim 5, wherein the further structural elements contain metals of groups 8 to 10.

7. The polymer as claimed in claim 1, wherein the following applies to the symbols and indices:

$Ar^1$, $Ar^2$, $Ar^3$ and $Ar^4$ are the same or different at each instance and are each an aromatic or heteroaromatic ring system selected from thiophene, benzene, pyridine, fluorene, spirobifluorene, anthracene or naphthalene, each of which bear from 0 to 2 substituents R1 at the free positions;

Ar-fus is the same or different at each instance and is an aromatic or heteroaromatic ring system selected from naphthalene, quinoline, anthracene, phenanthrene or pyrene, each of which bear from 0 to 2 substituents R1 at the free positions;

$Ar^5$ is the same or different at each instance and is an aromatic or heteroaromatic ring system selected from benzene, naphthalene, quinoline, anthracene, phenanthrene or pyrene, each of which bears from 0 to 2 substituents R1 at the free positions;

n, m, R1, R2 are each as described in claim 1.

8. The polymer as claimed in claim 1, wherein at least 2 nonaromatic carbon atoms are present on average per repeat unit in the substituents.

9. The polymer as claimed in claim 1, wherein no long-chain substituents having more than 12 carbon atoms are present in one linear chain.

10. The polymer as claimed in claim 1, wherein the polymer is prepared by SUZUKI coupling, YAMAMOTO coupling, STILLE coupling or HARTWIG-BUCHWALD coupling.

11. An electronic component which comprises one or more active layers, at least one of these active layers comprising one or more polymers as claimed in claim 1.

12. The polymer as claimed in claim 1, wherein the further structural elements are substituted or unsubstituted stilbenzylenes, tolanylenes, bisstyrylarylenes, bis(arylacetylene) arylenes, chrysenes, naphthacenes, pentacenes, perylenes or coronenes.

13. The polymer as claimed in claim 1, wherein the structural elements of the formula (I) type are selected from the formulae (II) to (XXXIV)

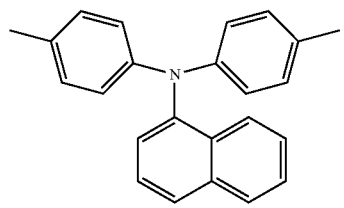

Formula (II)

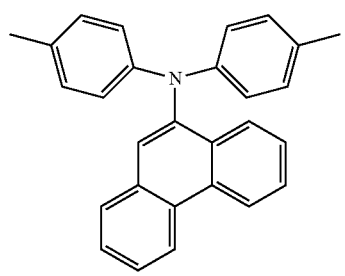

Formula (III)

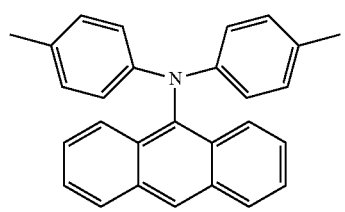

Formula (IV)

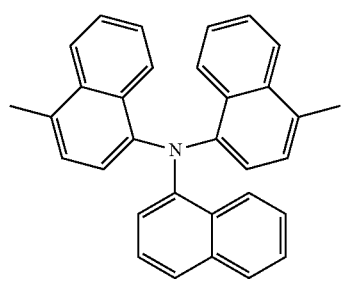

Formula (V)

-continued
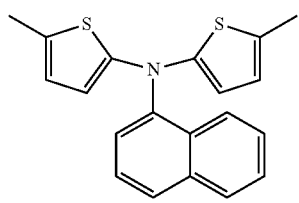
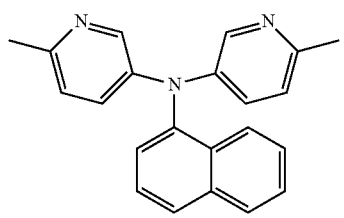
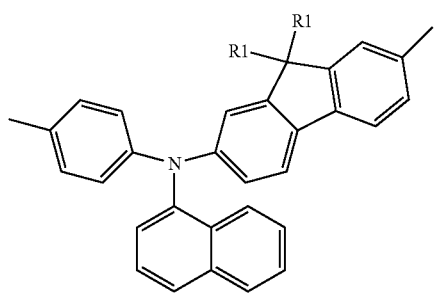
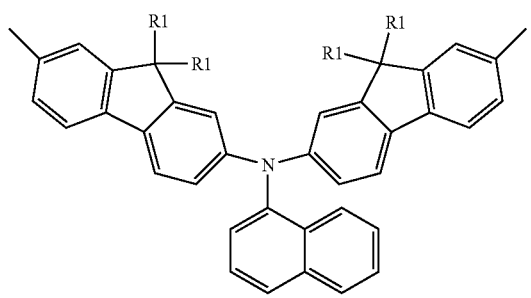
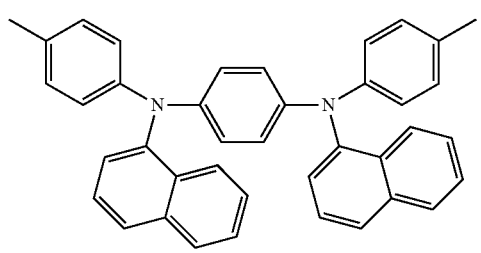
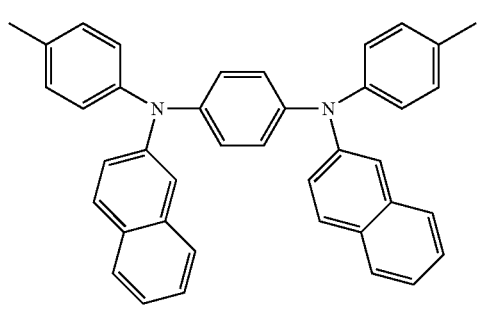
Formula (VI)
Formula (VII)
Formula (VIII)
Formula (IX)
Formula (X)
Formula (XI)

Formula (XII)
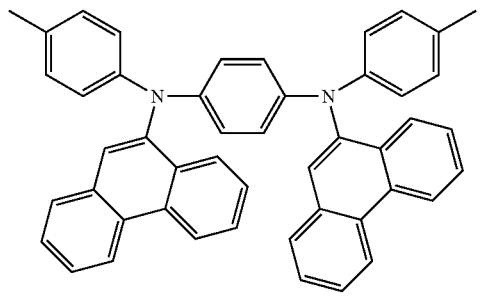
Formula (XIII)
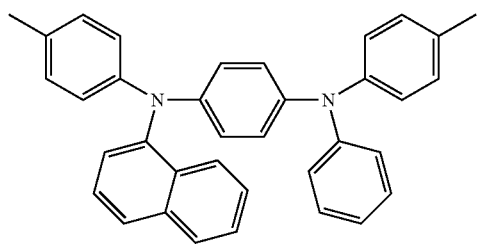
Formula (XIV)
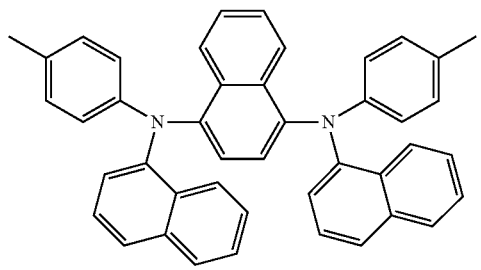
Formula (XV)
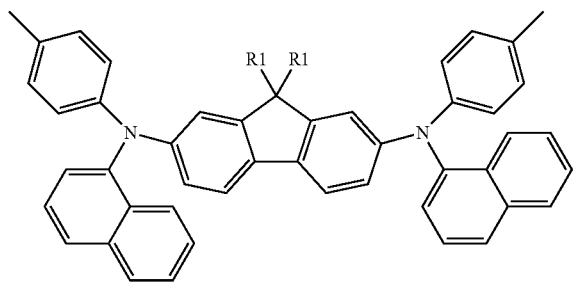
Formula (XVI)
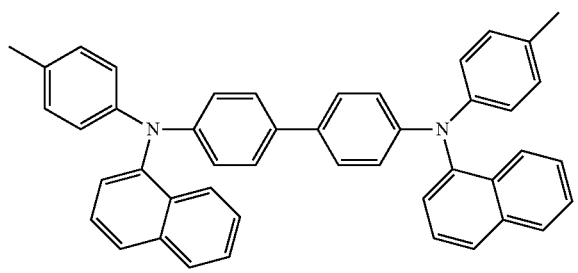

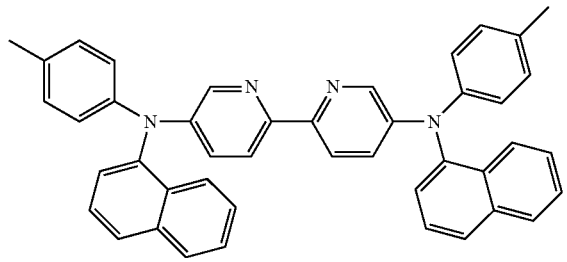
Formula (XVII)
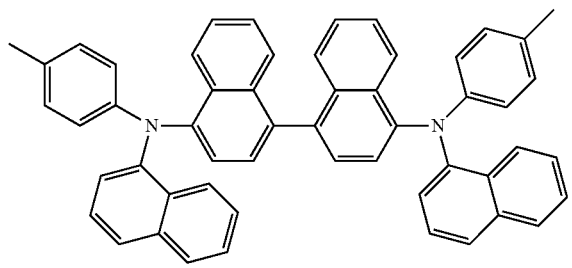
Formula (XVIII)
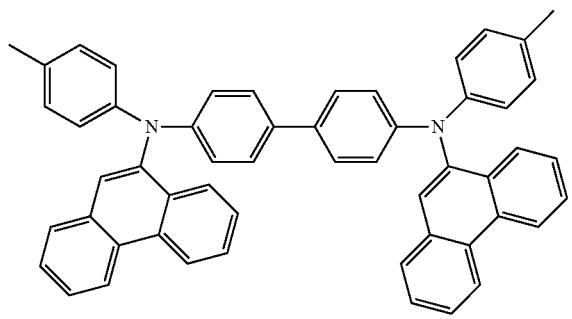
Formula (XIX)
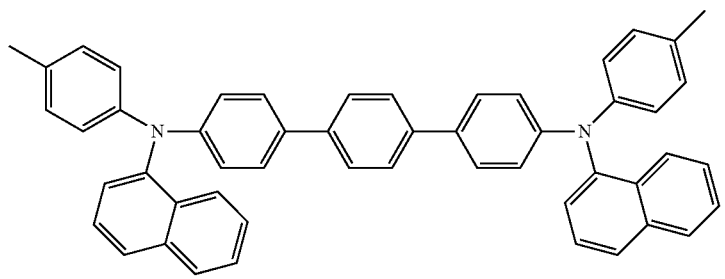
Formula (XX)
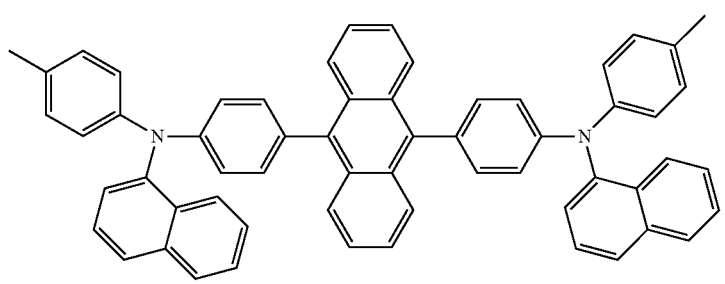
Formula (XXI)

-continued
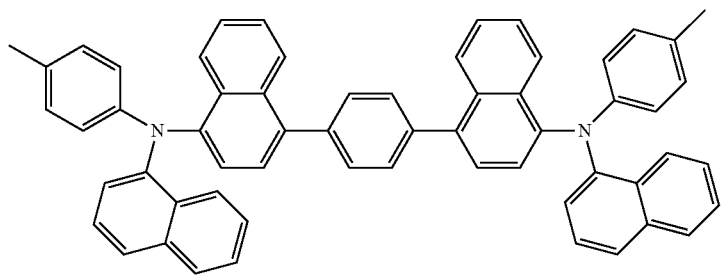
Formula (XXII)
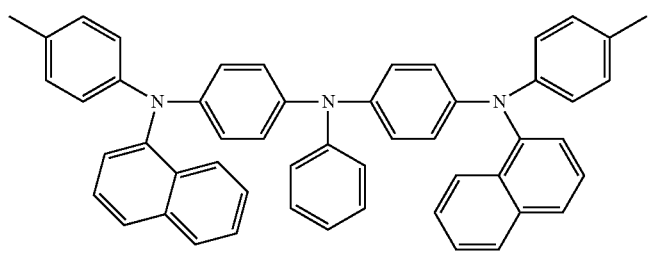
Formula (XXIII)
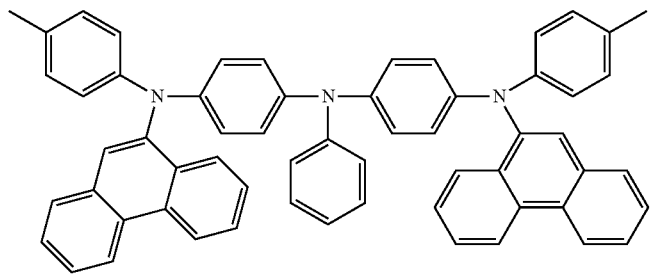
Formula (XXIV)
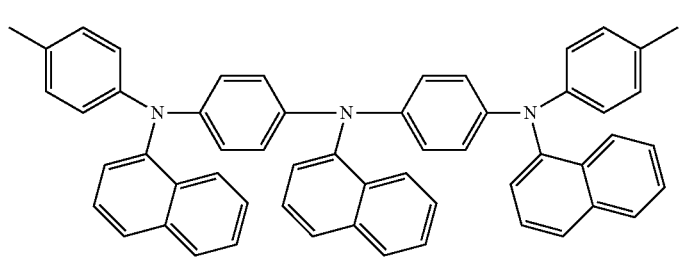
Formula (XXV)
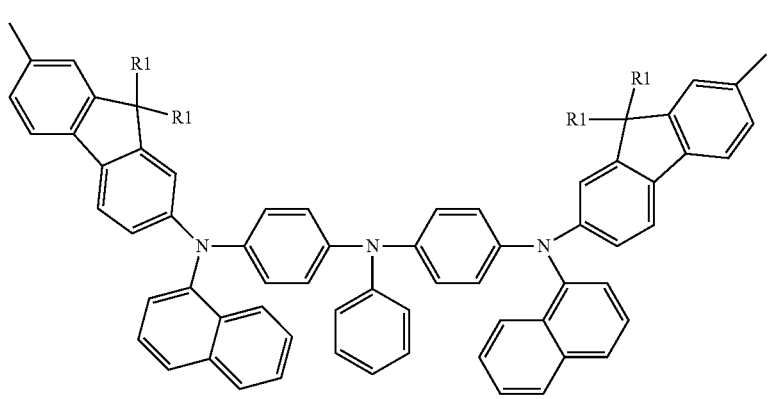
Formula (XXVI)

Formula (XXVII)
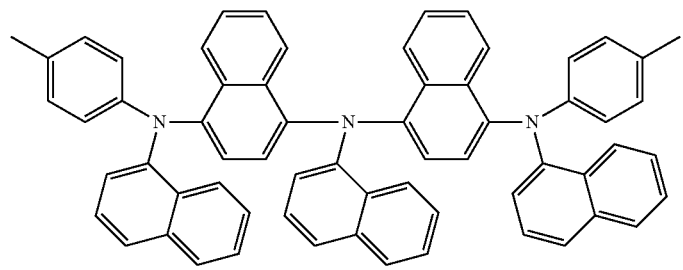
Formula (XXVIII)
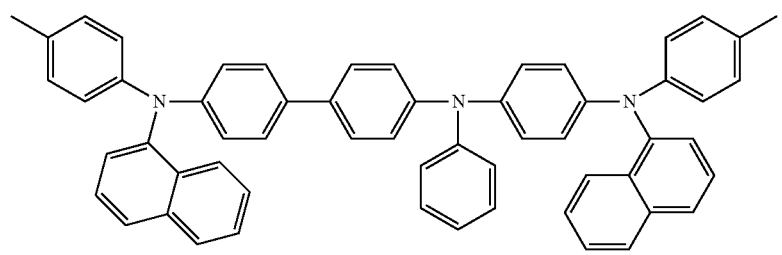
Formula (XXIX)
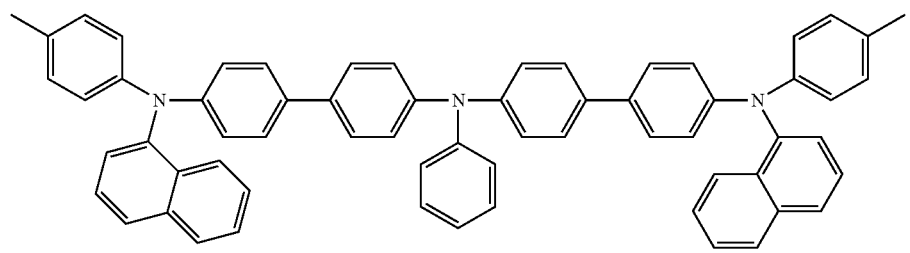
Formula (XXX)
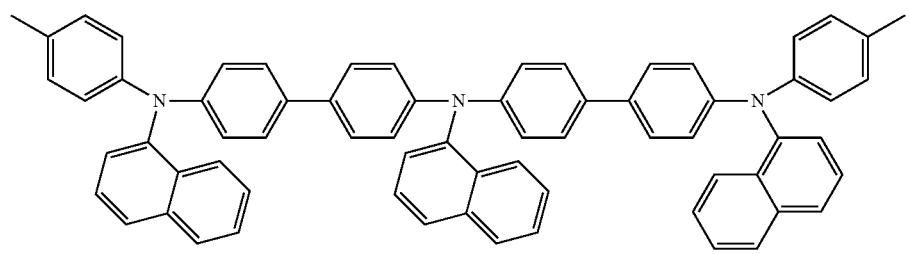
Formula (XXXI)
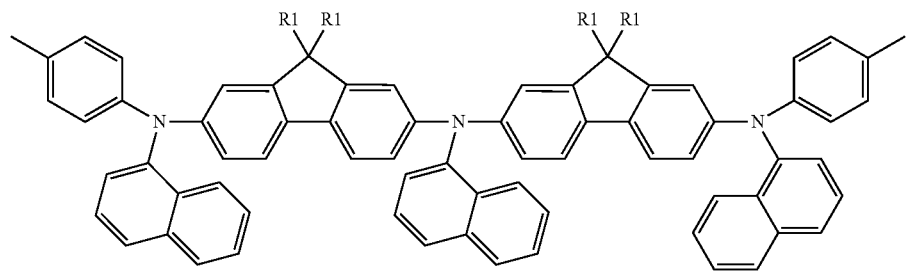

-continued

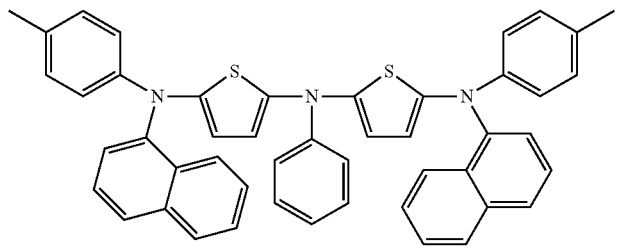

Formula (XXXII)

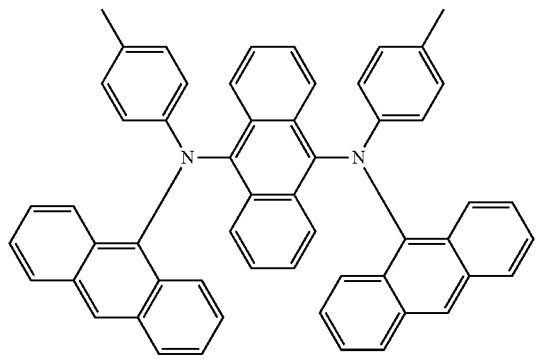

Formula (XXXIII)

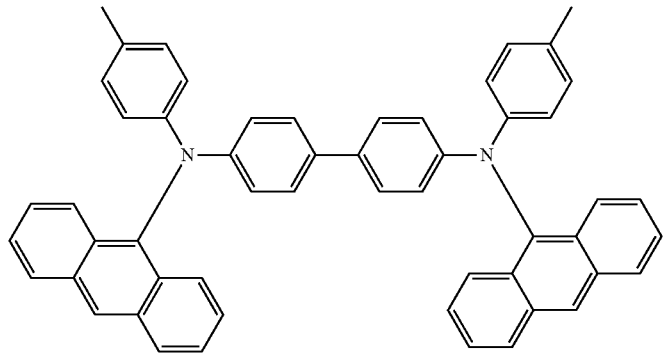

Formula (XXXIV)

14. An organic integrated circuits (O-ICs) which comprises the polymer as claimed in claim 1.

15. An organic field-effect transistors (OFETs) or an organic thin-film transistors (OTFTs) which comprises the polymer as claimed in claim 1.

16. An organic solar cells (O-SCs) which comprises the polymer as claimed in claim 1.

17. An organic light-emitting diodes (OLEDs) which comprises the polymer as claimed in claim 1.

18. An organic laser diodes (O-laser) which comprises the polymer as claimed in claim 1.

* * * * *